(12) United States Patent
Asano et al.

(10) Patent No.: US 7,659,135 B2
(45) Date of Patent: Feb. 9, 2010

(54) SEMICONDUCTOR DEVICE FABRICATION METHOD AND SEMICONDUCTOR DEVICE

(75) Inventors: Yuji Asano, Kawasaki (JP); Morio Kato, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/327,483

(22) Filed: Jan. 9, 2006

(65) Prior Publication Data

US 2007/0048890 A1    Mar. 1, 2007

(30) Foreign Application Priority Data

Aug. 31, 2005    (JP) .............................. 2005-251120

(51) Int. Cl.
 *H01L 21/00*    (2006.01)
(52) U.S. Cl. .................................. 438/72; 257/E21.456
(58) Field of Classification Search .................. 438/72, 438/57; 257/E21.456, E21.457
See application file for complete search history.

(56) References Cited

U.S. PATENT DOCUMENTS

| | | | | |
|---|---|---|---|---|
| 6,162,745 | A * | 12/2000 | Ito et al. ..................... | 438/795 |
| 6,423,457 | B1 * | 7/2002 | Bell ............................. | 430/30 |
| 6,846,694 | B2 * | 1/2005 | Fukushima et al. ........... | 438/57 |
| 2003/0143774 | A1 | 7/2003 | Takahashi et al. | |
| 2003/0168658 | A1 | 9/2003 | Fukushima et al. | |
| 2004/0014254 | A1 * | 1/2004 | Tsang ......................... | 438/57 |
| 2006/0220076 | A1 | 10/2006 | Okumura et al. | |

FOREIGN PATENT DOCUMENTS

| | | |
|---|---|---|
| JP | 11-214739 A | 8/1999 |
| JP | 11-312823 A | 11/1999 |
| JP | 2003-110098 | 4/2003 |
| JP | 2003-224253 A | 8/2003 |
| JP | 2003-264310 | 9/2003 |
| JP | 2006-278620 A | 10/2006 |

OTHER PUBLICATIONS

Japanese Office Action dated Jun. 3, 2008 issued in corresponding Application No. 2005-251120.

\* cited by examiner

*Primary Examiner*—Lex Malsawma
(74) *Attorney, Agent, or Firm*—Westerman, Hattori, Daniels & Adrian, LLP

(57) ABSTRACT

A semiconductor device fabrication method in which when a semiconductor device with a built-in light receiving element is fabricated, a section for dividing the light receiving element is protected from damage caused by, for example, etching. An antireflection coating is formed not only on a light receiving area in a divided photodiode area but on a division area including a junction area between a division section outside the light receiving area for dividing a photodiode and a cathode. A polycrystalline silicon film is formed so as to cover the antireflection coating. Accordingly, the antireflection coating on the junction area between the division section outside the light receiving area and the cathode is protected against, for example, etching by the polycrystalline silicon film. As a result, the appearance of a crystal defect, a change in impurity concentration, or the like is suppressed in this area. Therefore, a high-performance high-quality semiconductor device with a built-in photodiode can be fabricated.

10 Claims, 29 Drawing Sheets

SEMICONDUCTOR DEVICE FABRICATION METHOD AND SEMICONDUCTOR DEVICE

CROSS-REFERENCE TO RELATED APPLICATIONS

This application is based upon and claims the benefits of priority from the prior Japanese Patent Application No. 2005-251120, filed on Aug. 31, 2005, the entire contents of which are incorporated herein by reference.

BACKGROUND OF THE INVENTION (1) Field of the Invention

This invention relates to a semiconductor device and a semiconductor device fabrication method and, more particularly, to a semiconductor device with a built-in light receiving element including the light receiving element for converting an optical signal to an electrical signal and a circuit element for processing the converted electrical signal and a method for fabricating such a semiconductor device.

(2) Description of the Related Art

Conventionally, some semiconductor devices in which a light receiving element for converting an optical signal to an electrical signal and a circuit element for processing the converted electrical signal are formed on the same substrate have been proposed (see, for example, Japanese Patent Laid-Open Publication No. 2003-110098 or Japanese Patent Laid-Open Publication No. 2003-264310). Such semiconductor devices with a built-in light receiving element are used mainly in optical pickups and the like and are formed by integrating light receiving elements, such as photodiodes, and circuit elements, such as metal oxide semiconductor (MOS) transistors or bipolar transistors, onto the same substrate by the use of an integrated circuit (IC) process.

By the way, a photodiode formed in such a semiconductor device with a built-in light receiving element must have at least a certain level of receiving sensitivity according to a use for the semiconductor device. To meet this requirement, at present an antireflection coating is usually formed in a light receiving area of a photodiode included in a semiconductor device with the built-in photodiode. This prevents input light from being reflected. This antireflection coating is made up of, for example, two layers: an oxide film and a nitride film.

However, if the antireflection coating is formed in the light receiving area of the photodiode in this way, the thickness of the antireflection coating changes in the process of forming the semiconductor device. For example, the exposed antireflection coating in a photodiode area is also etched when etching is performed for forming a wiring pattern in a circuit element area. In addition, the antireflection coating is overetched when an interlayer dielectric or the like formed on the antireflection coating in the light receiving area of the photodiode is removed by etching to form an window from which light is inputted. As a result, the thickness of the antireflection coating may decrease.

Such a decrease in the thickness of the antireflection coating causes an increase or scatter in reflectance, resulting in a decrease in the receiving sensitivity of the photodiode. Moreover, damage caused by etching, plasma, and the like may deteriorate the leakage characteristics of the photodiode. Therefore, in order to suppress a decrease in the thickness of the antireflection coating, at present a protection layer is formed in advance on the antireflection coating by using an oxide film, polycrystalline silicon, or the like and is used for protecting the antireflection coating in the light receiving area against, for example, etching.

However, the above method in which the antireflection coating is protected by a protection layer may cause the following problems.

FIG. 25 is a schematic plan view showing an important part of a process for forming a conventional semiconductor device with a built-in divided photodiode. FIG. 26 is a schematic sectional view taken along lines D-D of FIG. 25. FIG. 27 is a schematic sectional view taken along lines E-E of FIG. 25.

In each of FIGS. 25 through 27, an important part of one process for forming a semiconductor device with a built-in photodiode including a four-divided photodiode (divided photodiode) and a MOS transistor is schematically shown. In FIG. 25, however, only an area (divided photodiode area) 100 where the divided photodiode included in the semiconductor device with a built-in photodiode is to be formed is shown.

As shown in FIGS. 26 and 27, in the divided photodiode area 100 shown in FIG. 25, an n-type epitaxial layer 102 is formed on a p-type silicon substrate 101. n-type diffusion layers (cathode area n-type diffusion layers) 103a and 103b used as cathode areas are formed in the n-type epitaxial layer 102. Each of the cathode area n-type diffusion layers 103a and 103b is defined with p-type buried diffusion layers 104a and 104b, a p-type well diffusion layer 105a, and a division section p-type diffusion layer 105b. An isolation section 106 on the periphery of the divided photodiode area 100 shown in FIG. 25 is formed by the p-type buried diffusion layer 104a and the p-type well diffusion layer 105a. A division section 107 inside the isolation section 106 shown in FIG. 25 is formed by the p-type buried diffusion layer 104b and the division section p-type diffusion layer 105b. The isolation section 106 not only defines an element area but also functions as an anode.

Excluding the isolation section 106 and the division section 107, the components in the substrate (including the p-type silicon substrate 101 and the n-type epitaxial layer 102 formed thereon) shown in FIGS. 26 and 27 are not shown in FIG. 25.

As shown in FIGS. 26 and 27, a silicon oxide film 108 is formed on the isolation section 106 and its vicinity by the method of local oxidation of silicon (LOCOS) and a second silicon oxide film 109 which is thinner than the silicon oxide film 108 is formed except on part of the cathode area n-type diffusion layer 103a and part of the cathode area n-type diffusion layer 103b. A silicon nitride film 110 is formed on the silicon oxide films 108 and 109 mainly on the division section 107 and a light receiving area 111 shown in FIGS. 25 through 27. An antireflection coating (not shown in FIG. 25) is made up of two layers of the silicon oxide film 109 and the silicon nitride film 110.

Hereinafter the "light receiving area" means not only an area in a completed photodiode to which light is inputted but an area in a photodiode under fabrication to which light is to be inputted after completion.

As shown in FIGS. 25 through 27, a polycrystalline silicon film 114 is formed on the antireflection coating in the light receiving area 111. As shown in FIGS. 26 and 27, the polycrystalline silicon film 114 is also formed in an area (cathode electrode area) 112 where a cathode electrode is to be formed and an area (anode electrode area) 113 where an anode electrode is to be formed. The polycrystalline silicon films 114 formed on the antireflection coating in the light receiving area 111, in the cathode electrode area 112, and in the anode electrode area 113 are separated from one another.

The polycrystalline silicon film 114 formed on the antireflection coating in the light receiving area 111 functions as a protection layer for protecting the antireflection coating against, for example, etching performed later. The polycrystalline silicon film 114 formed in the cathode electrode area 112 functions as part of the cathode electrode and a metal electrode is finally formed on it. Similarly, the polycrystalline silicon film 114 formed in the anode electrode area 113 functions as part of the anode electrode and a metal electrode is finally formed on it.

The divided photodiode area 100 having the above structure is formed simultaneously with the MOS transistor. If polycrystalline silicon is used as a material for a gate electrode of the MOS transistor, usually gate polycrystalline silicon is formed in an area (MOS transistor area) where the MOS transistor is to be formed simultaneously with the polycrystalline silicon films 114. Insulating films, such as a silicon oxide film and a silicon nitride film, are then formed and etched to form a sidewall. At this time the divided photodiode area 100 also suffers etching, but the antireflection coating formed in the light receiving area 111 is protected against the etching by the polycrystalline silicon film 114 formed thereon.

One of the reasons for forming the polycrystalline silicon film 114 in the divided photodiode area 100 is that the antireflection coating in the light receiving area 111 must be protected. However, the polycrystalline silicon film 114 is not formed on the antireflection coating or the like formed on, for example, an area (lead electrode area) 115 which is outside the light receiving area 111 and around the cathode electrode area 112. Accordingly, the antireflection coating or the like formed on the lead electrode area 115 is not protected against, for example, the etching.

Each of FIGS. 28 and 29 is a schematic sectional view showing an important part of an etching process. Each of FIGS. 28 and 29 is a sectional view showing the state of the semiconductor device after etching and taken along lines D-D of FIG. 25 as shown in FIG. 26.

As described above, it is assumed that the polycrystalline silicon film 114 is formed only on the antireflection coating in the light receiving area 111, in the cathode electrode area 112, and in the anode electrode area 113 and that etching is performed. In this case, the antireflection coating which is exposed in the lead electrode area 115 outside the light receiving area 111 is etched. For example, the antireflection coating on the division section 107 shown in FIG. 26 is etched. Accordingly, as shown in FIG. 28, most of the silicon nitride film 110, being the upper layer of the antireflection coating formed on the division section 107 outside the light receiving area 111, may be removed. Alternatively, as shown in FIG. 29, even the silicon oxide film 109, being the lower layer of the antireflection coating formed on the division section 107 outside the light receiving area 111, may be removed. In this case, the n-type epitaxial layer 102 and the division section p-type diffusion layer 105b get exposed.

As shown in FIG. 28, it is assumed that most of the silicon nitride film 110, being the upper layer of the antireflection coating, is removed. When treatment in an oxidation atmosphere or the chemical vapor deposition (CVD) growth of a silicon oxide film is performed later, the atmosphere or temperature has a great influence and impurities, such as boron, in the division section 107 are apt to be entrapped in the silicon oxide film 109 formed thereon. As a result, impurity concentration lowers in a surface area of the substrate and there is a strong possibility that a leakage current flows between different photodiodes.

As shown in FIG. 29, it is assumed that not only the silicon nitride film 110, being the upper layer of the antireflection coating, but also the silicon oxide film 109, being the lower layer of the antireflection coating, is removed. The n-type epitaxial layer 102 and the division section p-type diffusion layer 105b, and the cathode area n-type diffusion layers 103a and 103b which have got exposed by the etching are damaged by the etching. As a result, there appear crystal defects. In this case, there is a strong possibility that a junction leakage current flows especially in the division section 107.

The flowing of the above leakage current leads to a deterioration in the characteristics of the photodiodes and the performance of the entire semiconductor device with a built-in photodiode.

The descriptions have been given with the case where the photodiode and the MOS transistor are formed on the same substrate as an example. However, the above problems may also arise in the case where another light receiving element is formed or where a bipolar transistor is formed, depending on its structure.

SUMMARY OF THE INVENTION

The present invention was made under the background circumstances described above. An object of the present invention is to provide a high-performance high-quality semiconductor device with a built-in light receiving element and a method for fabricating such a semiconductor device.

In order to achieve the above object, a method for fabricating a semiconductor device with a built-in light receiving element is provided. This method comprises the processes of forming an antireflection coating on a light receiving area of a divided light receiving element, on a division section outside the light receiving area for dividing the light receiving element, and on a vicinity of the division section outside the light receiving area; and forming a protection layer for protecting the antireflection coating on the antireflection coating.

Moreover, in order to achieve the above object, a semiconductor device with a built-in light receiving element is provided. This semiconductor device comprises an antireflection coating on a division section outside a light receiving area of a divided light receiving element for dividing the light receiving element and on a vicinity of the division section outside the light receiving area.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described in detail with reference to the drawings by taking a semiconductor device with a built-in photodiode as an example.

A first embodiment of the present invention will be described first.

Figure 1:
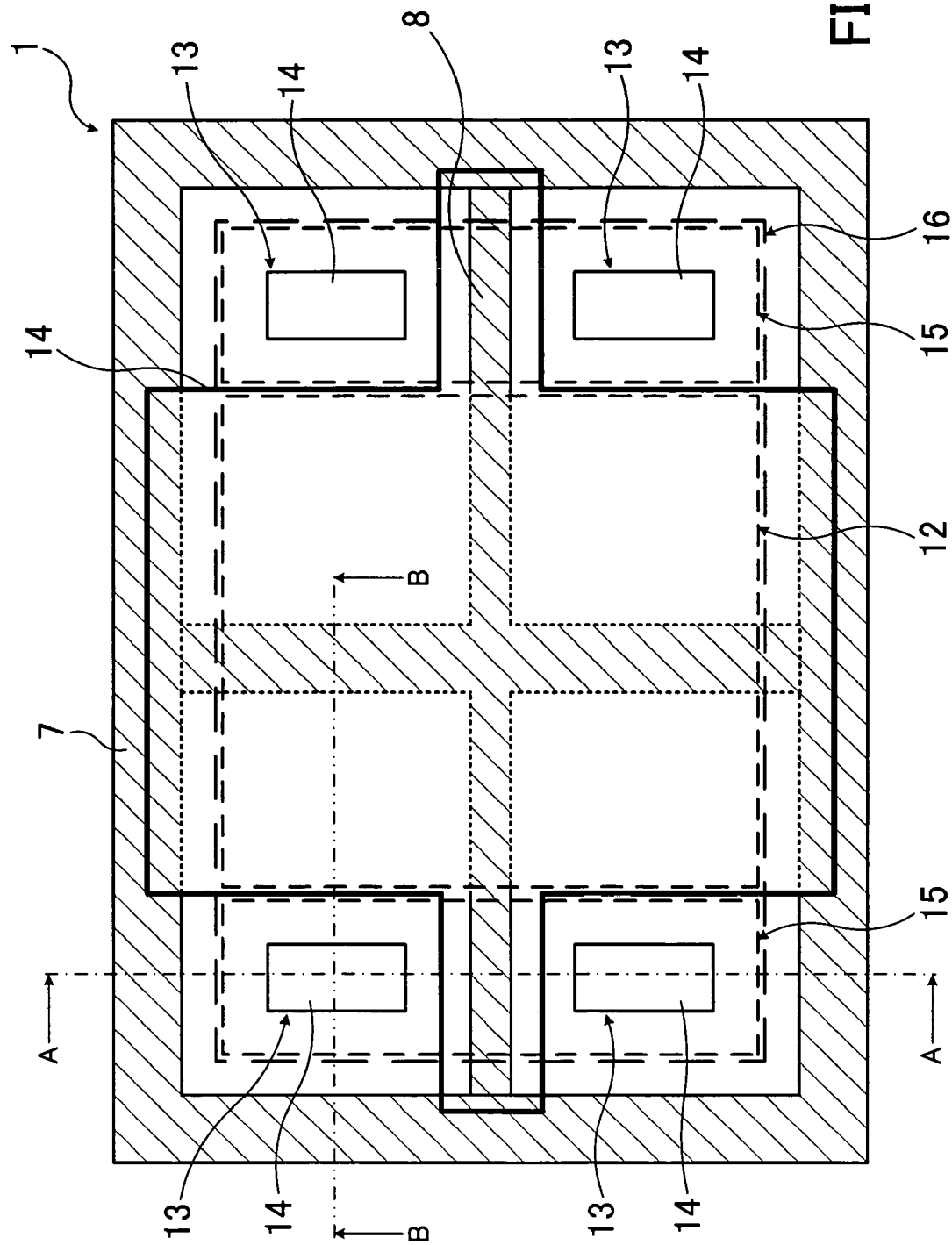
FIG. 1 is a schematic plan view showing an important part of a method for forming a semiconductor device with a built-in photodiode, according to a first embodiment of the present invention.
Figure 2:
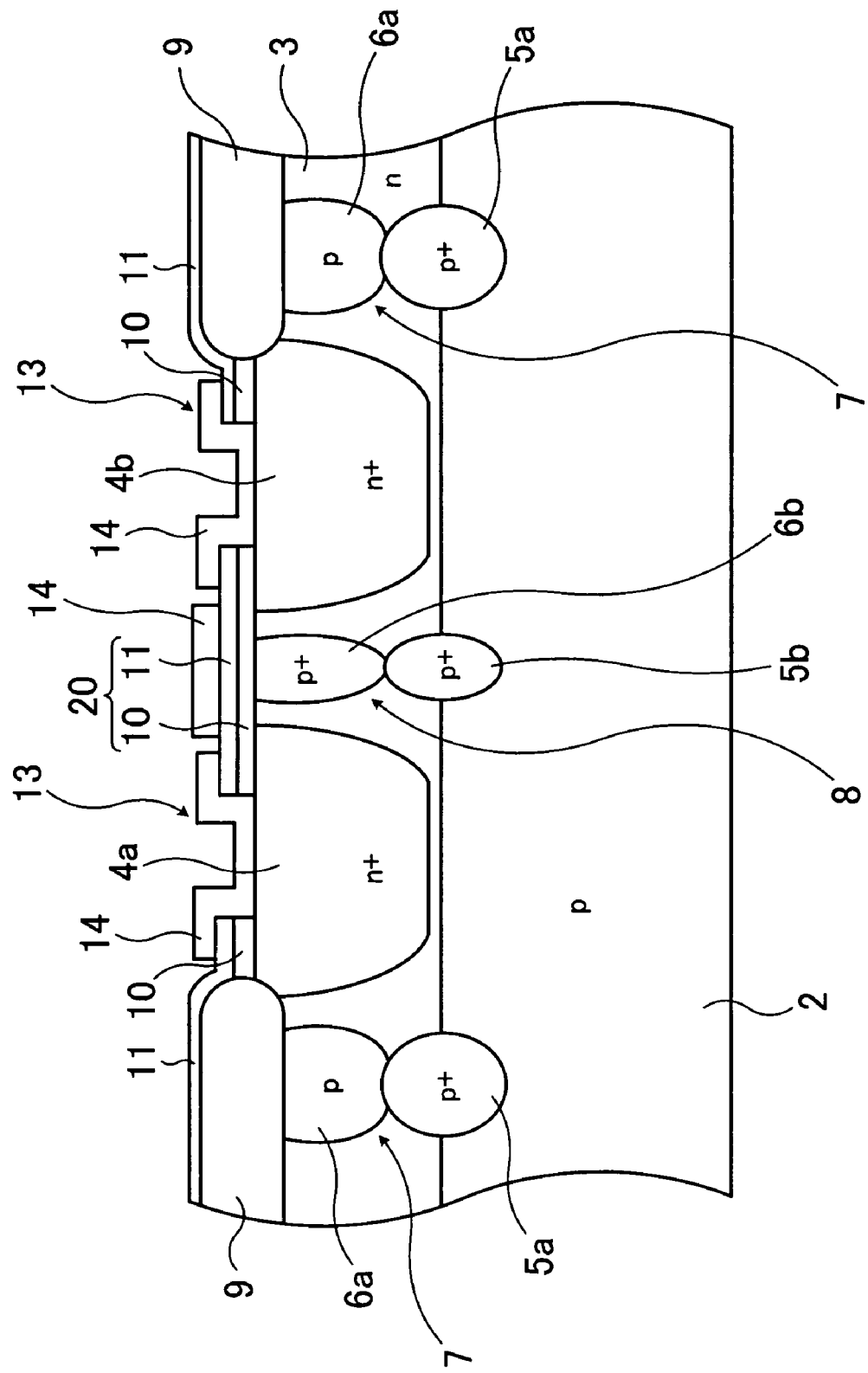
FIG. 2 is a schematic sectional view taken along lines A-A of FIG. 1.

FIG. 1 is a schematic plan view showing an important part of a method for forming a semiconductor device with a built-in photodiode, according to a first embodiment of the present invention. FIG. 2 is a schematic sectional view taken along lines A-A of FIG. 1.

FIGS. 1 and 2 schematically show an important part of one of processes for forming a semiconductor device with a built-in photodiode including a four-divided photodiode and a CMOS transistor. In FIG. 1, however, only a divided photodiode area 1 where a divided photodiode is to be formed is shown and a MOS transistor area is not shown.

As shown in FIG. 2, an n-type epitaxial layer 3 is formed on a p-type silicon substrate 2 in the divided photodiode area 1 shown in FIG. 1. Cathode area n-type diffusion layers 4a and 4b are formed in the n-type epitaxial layer 3. Each of the cathode area n-type diffusion layers 4a and 4b is defined by p-type buried diffusion layers 5a and 5b, a p-type well diffusion layer 6a, and a division section p-type diffusion layer 6b. An isolation section 7 at the edge of the divided photodiode area 1 shown in FIG. 1 is formed by the p-type buried diffusion layer 5a and the p-type well diffusion layer 6a. A division section 8 inside the isolation section 7 shown in FIG. 1 is formed by the p-type buried diffusion layer 5b and the division section p-type diffusion layer 6b. The n-type epitaxial layer 3, together with the cathode area n-type diffusion layers 4a and 4b, also functions as a cathode. The isolation section 7 not only defines an element area but functions as an anode.

Excluding the isolation section 7 and the division section 8, the components in the substrate (including the p-type silicon substrate 2 and the n-type epitaxial layer 3 formed thereon) shown in FIG. 2 are not shown in FIG. 1.

As shown in FIG. 2, a silicon oxide film (LOCOS oxide film) 9 is formed on the isolation section 7 and its vicinity by the method of local oxidation of silicon (LOCOS) and a second silicon oxide film 10 which is thinner than the silicon oxide film 9 is formed except part of the cathode area n-type diffusion layer 4a and part of the cathode area n-type diffusion layer 4b. A silicon nitride film 11 is formed on the silicon oxide films 9 and 10 mainly in a light receiving area 12 and over the division section 8 and its vicinity shown in FIGS. 1 and 2. An antireflection coating 20 (not shown in FIG. 1) is made up of two layers of the silicon oxide film 10 and the silicon nitride film 11.

In the first embodiment of the present invention, a polycrystalline silicon film 14 is formed on the antireflection coating 20 in the light receiving area 12 and on the antireflection coating 20 formed on the division section 8 and its vicinity (junction of the division section 8 and the cathode). The polycrystalline silicon film 14 formed on the antireflection coating 20 in the light receiving area 12 and on the antireflection coating 20 formed on the division section 8 and its vicinity outside the light receiving area 12 functions as a protection layer for protecting the antireflection coating 20 against, for example, etching performed later.

The polycrystalline silicon film 14 is also formed in a cathode electrode area 13 and an anode electrode area. The polycrystalline silicon film 14 formed in the cathode electrode area 13 functions as part of a cathode electrode and a metal electrode is finally formed on it. Similarly, the polycrystalline silicon film 14 formed in the anode electrode area functions as part of an anode electrode and a metal electrode is finally formed on it.

The polycrystalline silicon films 14 formed on the antireflection coating 20 in the light receiving area 12, in the cathode electrode area 13, and in the anode electrode area are separated from one another. The formation of the polycrystalline silicon films 14 in the cathode electrode area 13 and the anode electrode area may be omitted.

As stated above, in the first embodiment of the present invention the polycrystalline silicon film 14 is formed not only on the antireflection coating 20 in the light receiving area 12 but on the antireflection coating 20 formed on the division section 8 and its vicinity in a lead electrode area 15 outside the light receiving area 12. Accordingly, even if etching is performed in this state to form a sidewall in the MOS transistor area, not only the antireflection coating 20 in the light receiving area 12 in the divided photodiode area 1 but the antireflection coating 20 on the division section 8 and its vicinity outside the light receiving area 12 is protected against the etching by the polycrystalline silicon film 14 formed thereon.

Figure 3:
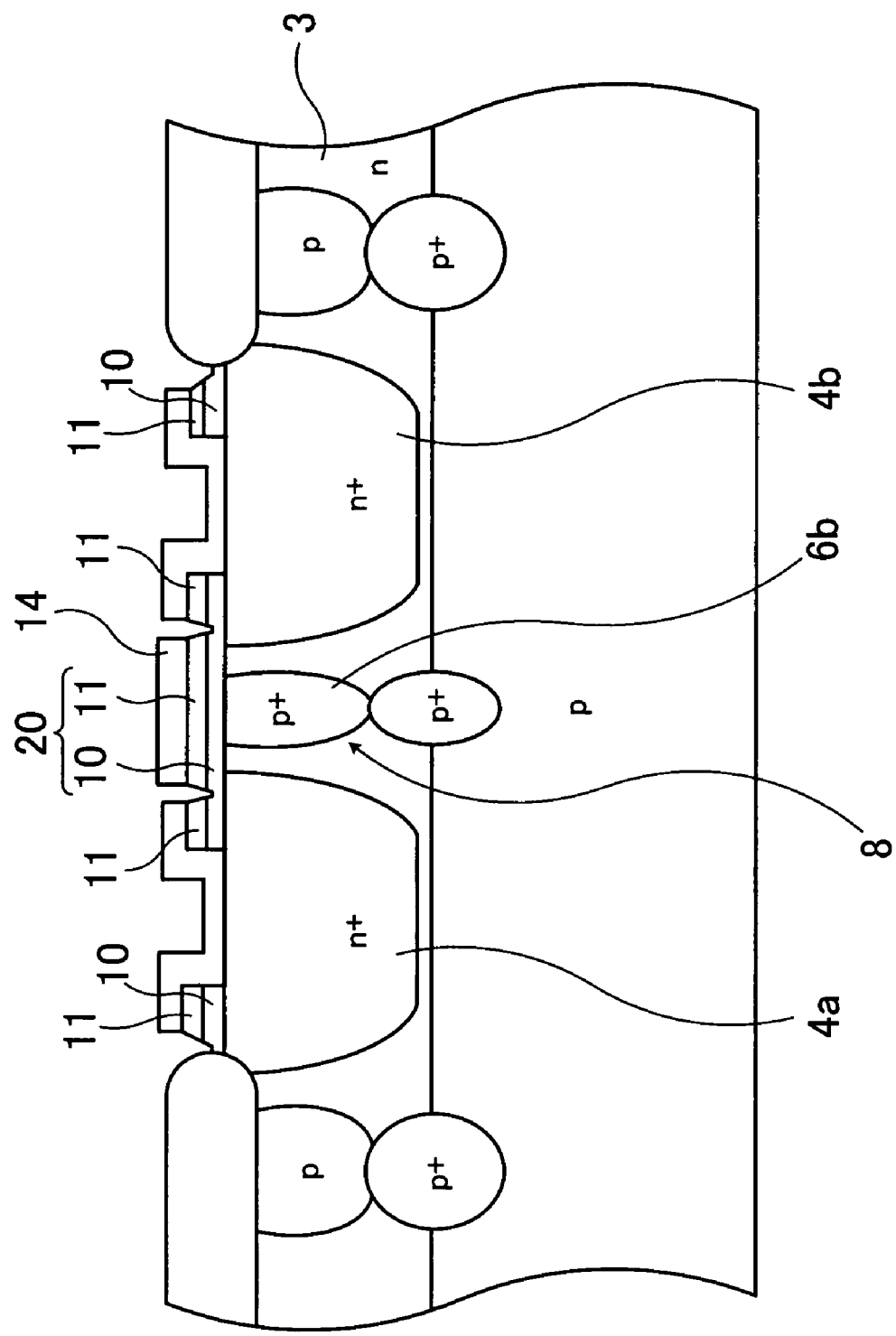
FIG. 3 is a schematic sectional view of an important part showing a state after an etching process.

FIG. 3 is a schematic sectional view of an important part showing a state after the etching process. FIG. 3 is a sectional view showing the state of the semiconductor device after the etching and taken along lines A-A of FIG. 1.

As described above, in the first embodiment of the present invention not only the antireflection coating 20 in the light receiving area 12 but the antireflection coating 20 on the division section 8 and its vicinity outside the light receiving area 12 is protected against the etching by the polycrystalline silicon film 14. Therefore, as shown in FIG. 3, the division section 8 and its vicinity outside the light receiving area 12 are not directly damaged at etching time.

As a result, a drop in impurity concentration or the appearance of a crystal defect in the surface area of the division section 8 outside the light receiving area 12 can be prevented. This effectively suppresses a leakage current. Therefore, it is possible to form a high-performance high-quality semiconductor device with a built-in photodiode without deteriorating the characteristics of the photodiode.

The method for forming a semiconductor device with a built-in photodiode, according to the first embodiment of the present invention will now be described in detail with reference to FIGS. 4 through 10 and 1 through 3. In the following descriptions, a CMOS transistor included in a semiconductor device with a built-in photodiode is an n-channel MOS transistor.

Figure 4:
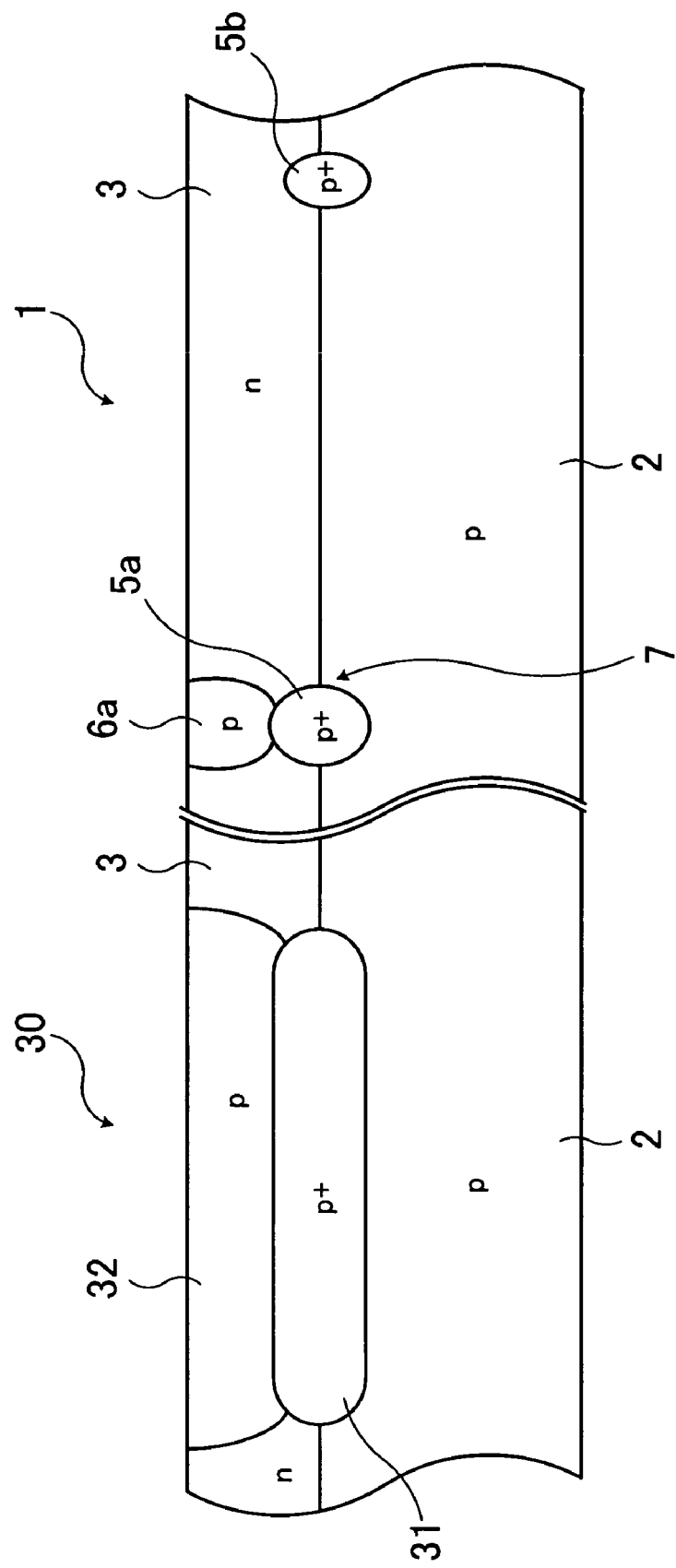
FIG. 4 is a schematic sectional view showing an important part of a first formation process in the first embodiment of the present invention.
Figure 5:
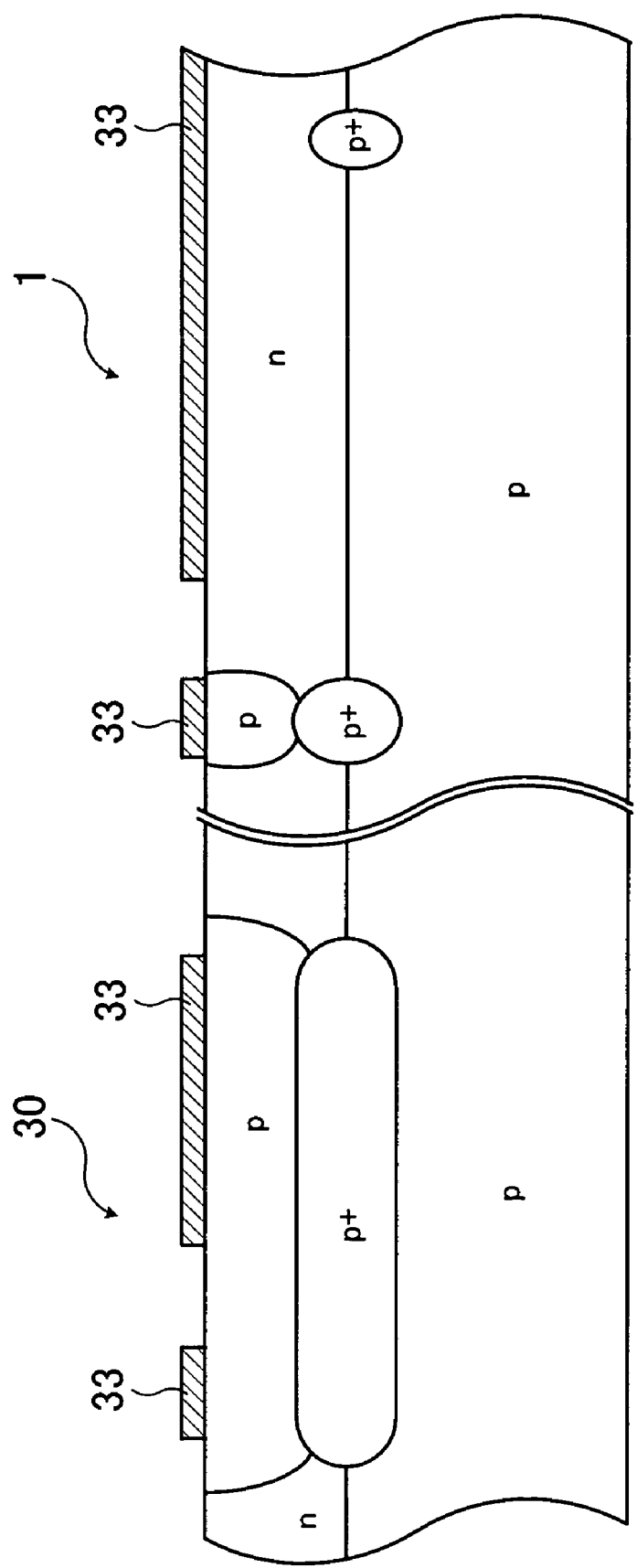
FIG. 5 is a schematic sectional view showing an important part of a second formation process in the first embodiment of the present invention.
Figure 6:
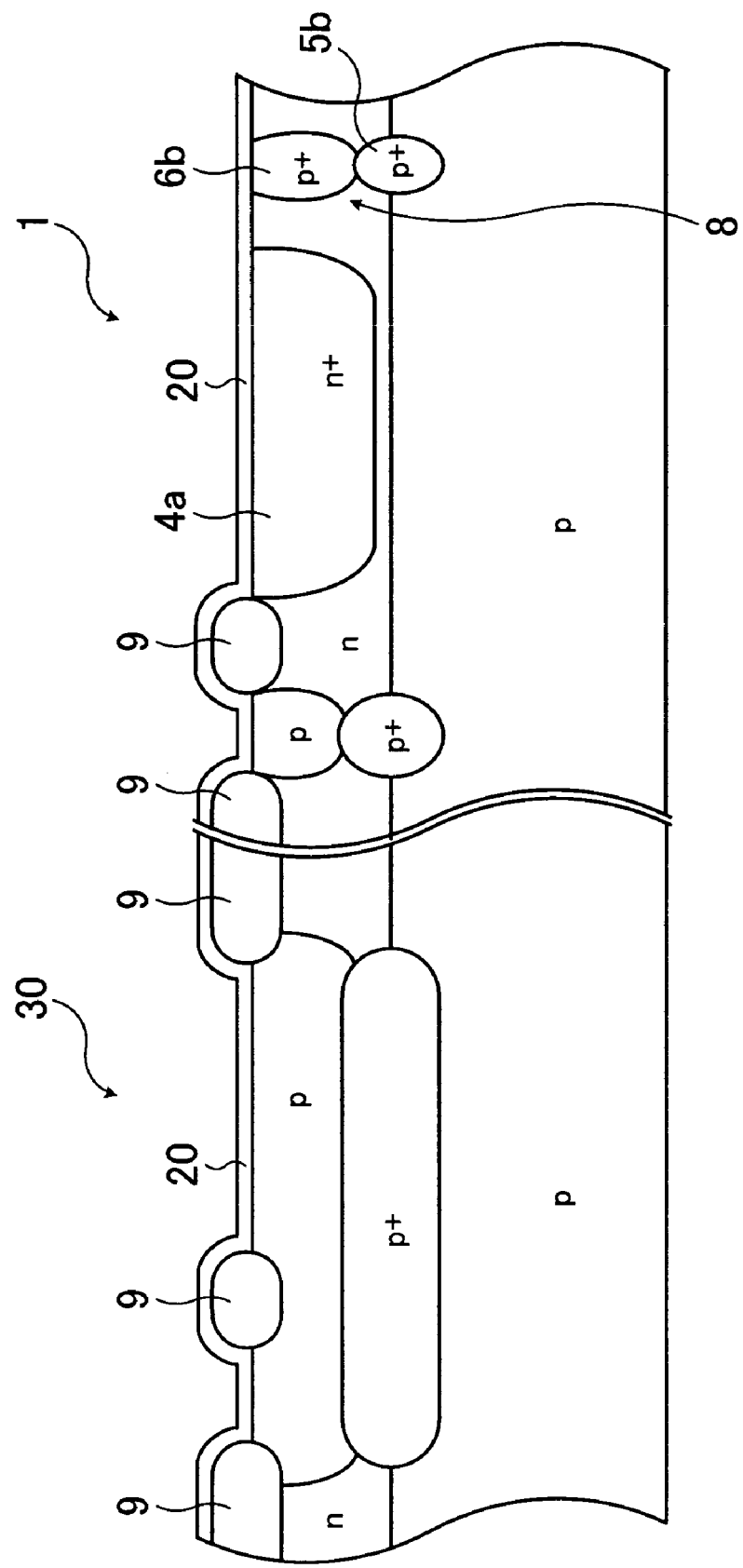
FIG. 6 is a schematic sectional view showing an important part of a third formation process in the first embodiment of the present invention.
Figure 7:
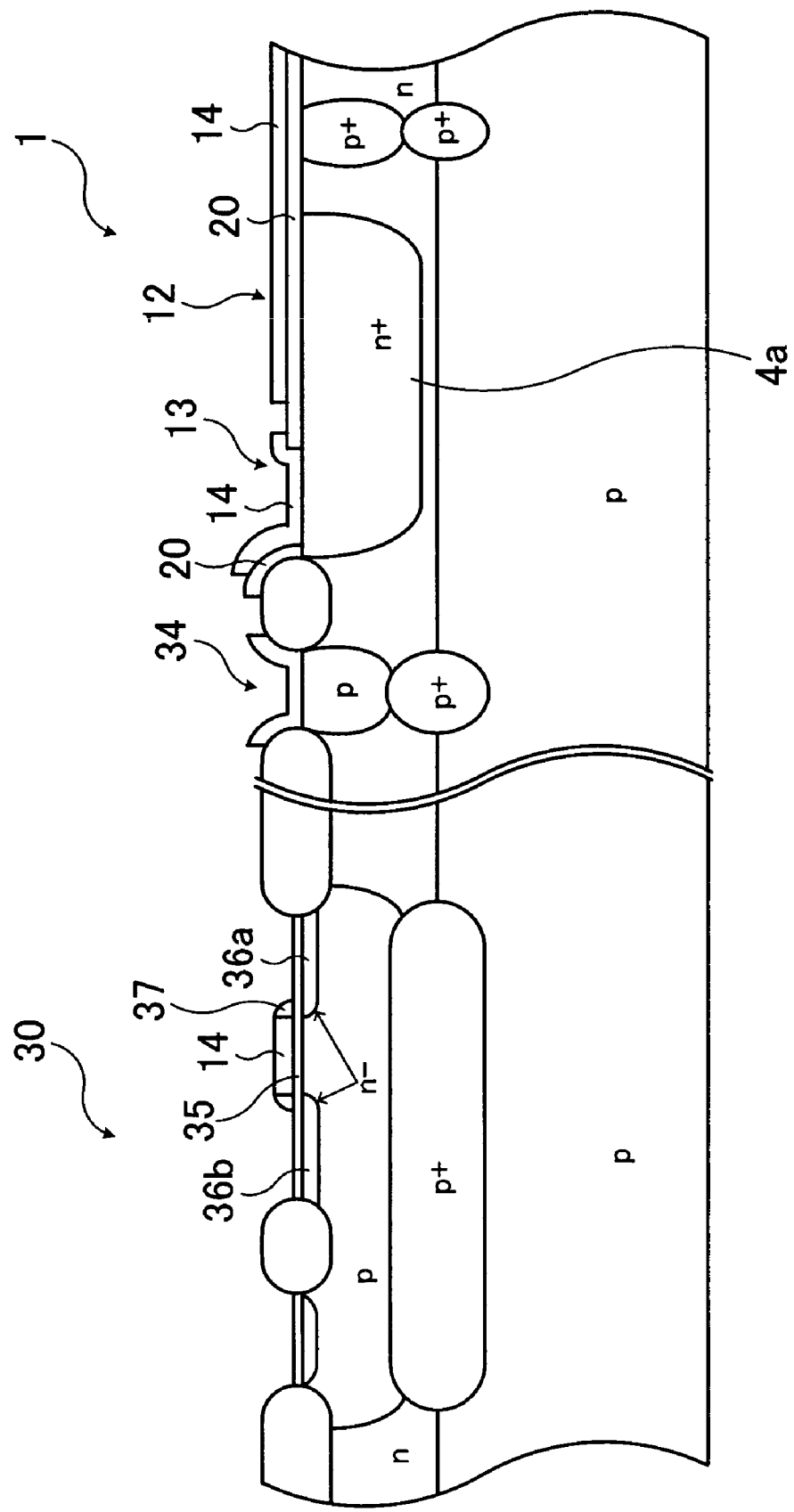
FIG. 7 is a schematic sectional view showing an important part of a fourth formation process in the first embodiment of the present invention.
Figure 8:
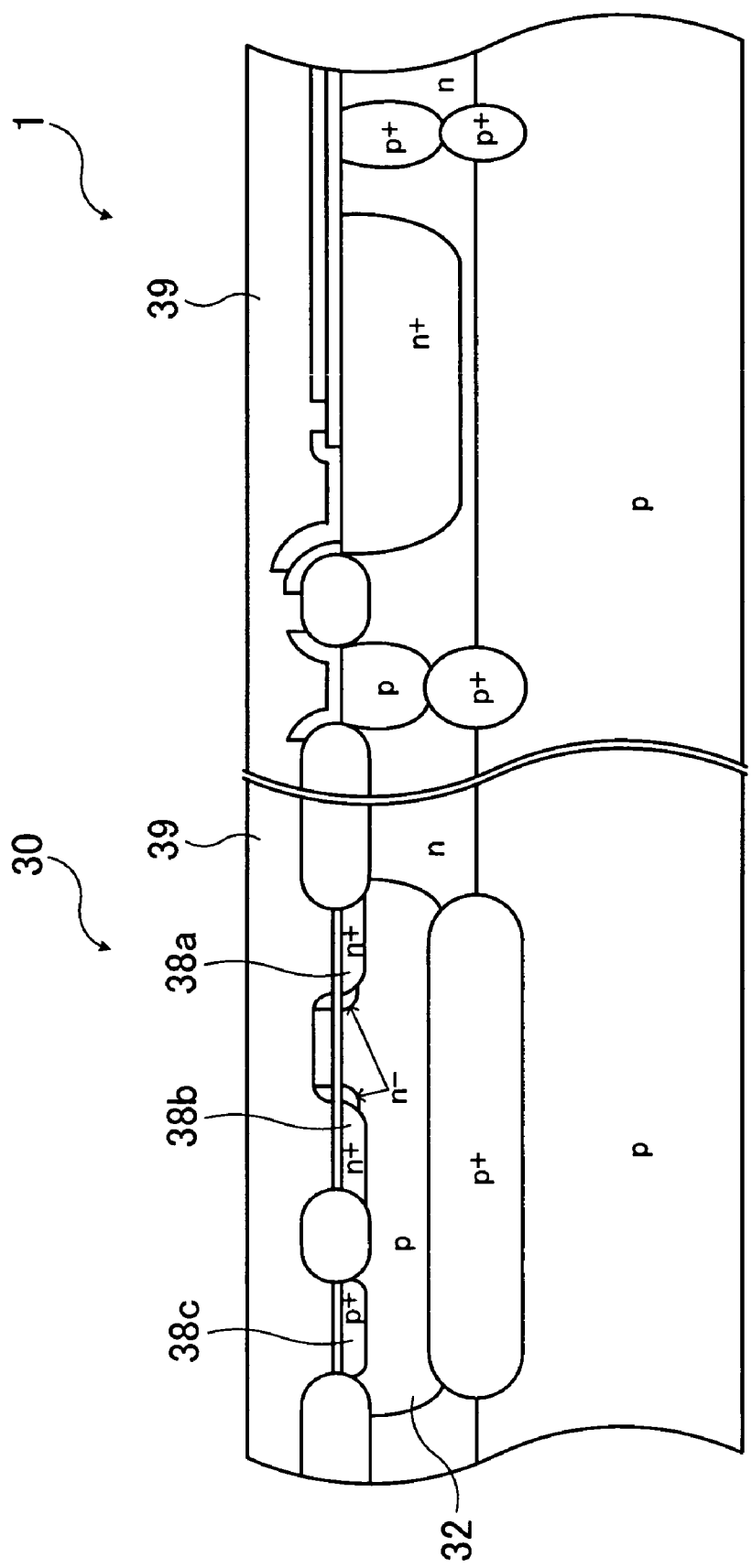
FIG. 8 is a schematic sectional view showing an important part of a fifth formation process in the first embodiment of the present invention.
Figure 9:
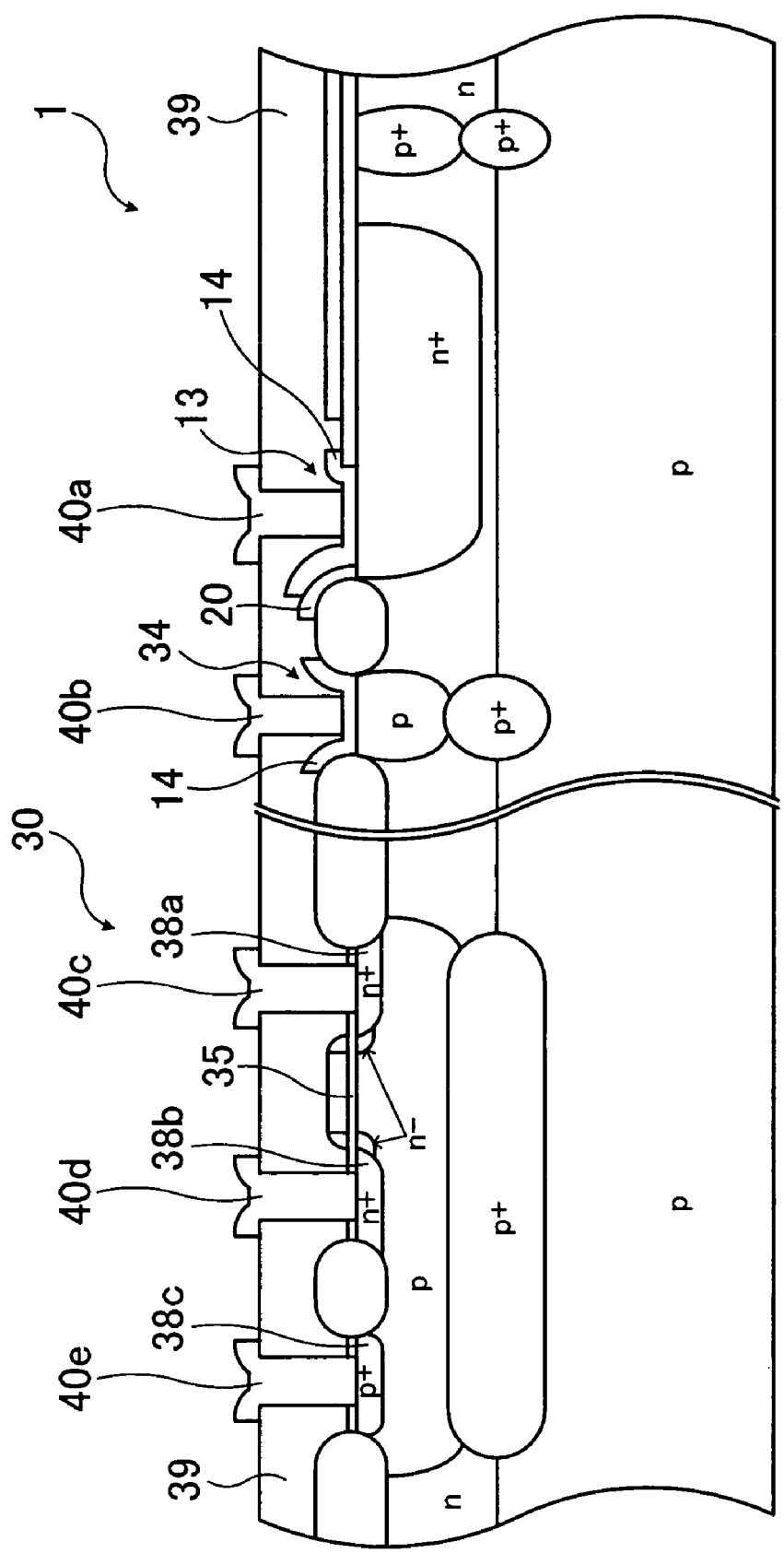
FIG. 9 is a schematic sectional view showing an important part of a sixth formation process in the first embodiment of the present invention.
Figure 10:
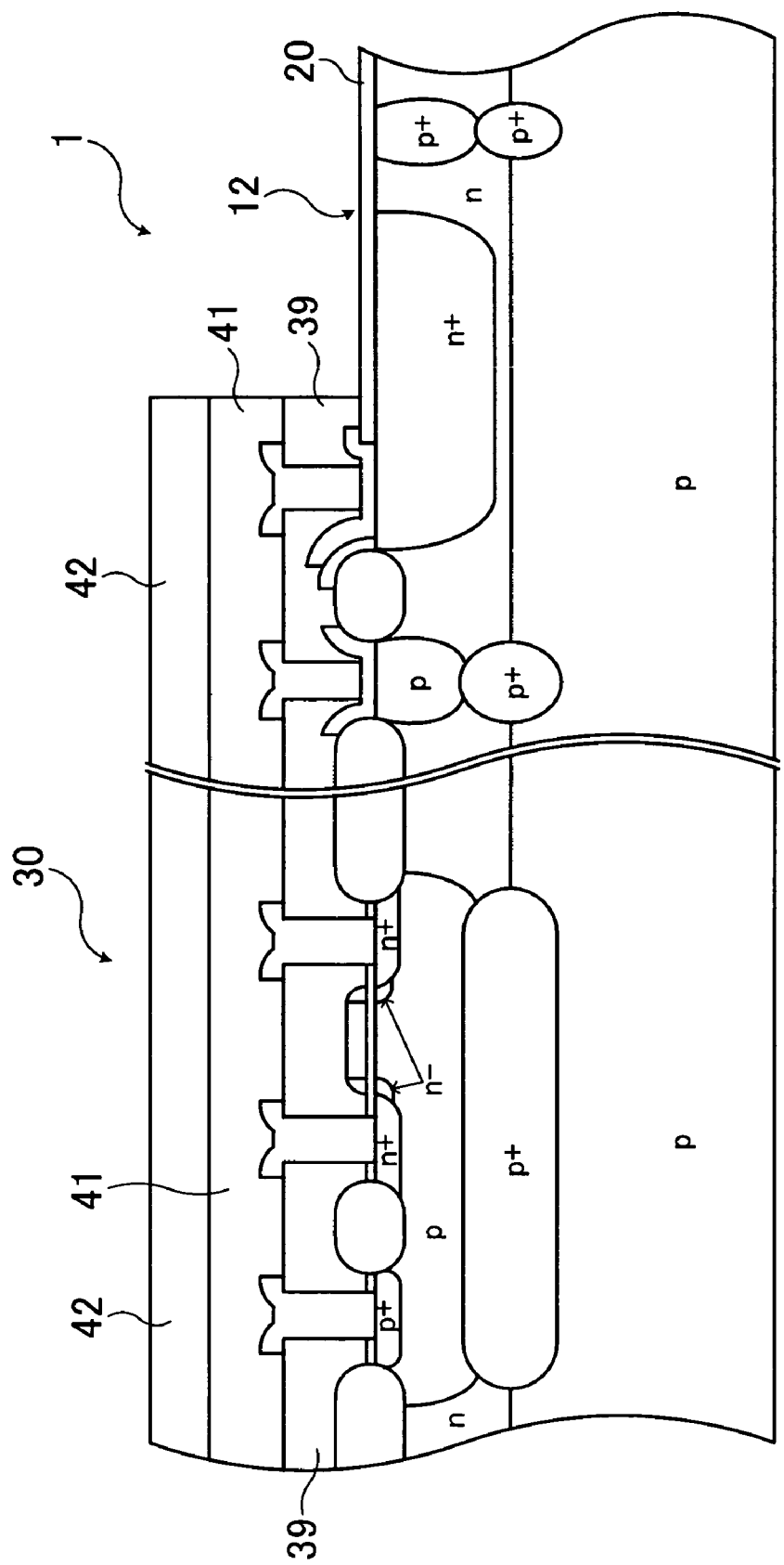
FIG. 10 is a schematic sectional view showing an important part of a seventh formation process in the first embodiment of the present invention.

FIG. 4 is a schematic sectional view showing an important part of a first formation process in the first embodiment of the present invention. FIG. 5 is a schematic sectional view showing an important part of a second formation process in the first embodiment of the present invention. FIG. 6 is a schematic sectional view showing an important part of a third formation process in the first embodiment of the present invention. FIG. 7 is a schematic sectional view showing an important part of a fourth formation process in the first embodiment of the present invention. FIG. 8 is a schematic sectional view showing an important part of a fifth formation process in the first embodiment of the present invention. FIG. 9 is a schematic sectional view showing an important part of a sixth formation process in the first embodiment of the present invention. FIG. 10 is a schematic sectional view showing an important part of a seventh formation process in the first embodiment of the present invention. The sectional views of FIGS. 4 through 10 showing the divided photodiode area 1 are taken along lines B-B of FIG. 1. Components in FIGS. 4 through 10 that are the same as those shown in FIGS. 1 through 3 are marked with the same symbols and detailed descriptions of them will be omitted.

First, as shown in FIG. 4, p-type buried diffusion layers 5a, 5b, and 31 are formed in predetermined positions in the divided photodiode area 1 and the MOS transistor area 30 on the p-type silicon substrate 2 with a resistivity of about 500 $\Omega$cm. The n-type epitaxial layer 3 with a resistivity of about 1 $\Omega$cm and a thickness of about 2 µm is then formed on the entire surface of the p-type silicon substrate 2. A silicon oxide film with a thickness of about 30 nm (not shown) is formed on the n-type epitaxial layer 3. Ion implantation is performed on the p-type silicon substrate 2 through the silicon oxide film to form p-type well diffusion layers 6a and 32 in predetermined positions in the divided photodiode area 1 and the MOS transistor area 30 respectively. The isolation section 7 in the divided photodiode area 1 is made up of the p-type well diffusion layer 6a and the p-type buried diffusion layer 5a previously formed. The silicon oxide film formed on the n-type epitaxial layer 3 also functions as a pad oxide film at the time of oxidation by the LOCOS method described later.

As shown in FIG. 5, after the p-type well diffusion layers 6a and 32 are formed, a silicon nitride mask 33 which has openings in predetermined positions in the divided photodiode area 1 and the MOS transistor area 30 and which has a thickness of about 100 nm is formed to form a silicon oxide film 9 by the LOCOS method. Part of the mask 33 is formed in an area 16 shown in FIG. 1.

By using the mask 33, the silicon oxide film 9 with a thickness of about 600 nm is formed in positions shown in FIG. 6. After that, the mask 33 is removed and the pad oxide film in areas enclosed by the silicon oxide film 9, that is to say, in areas where the photodiode and the MOS transistor are to be formed is removed.

As shown in FIG. 6, the above silicon oxide film 10 and silicon nitride film 11 are formed in that order on the entire surface to form the antireflection coating 20 made up of two layers of the silicon oxide film 10 and the silicon nitride film 11. The antireflection coating 20 is formed so as to have a low reflection factor for, for example, a laser beam used for the semiconductor device with a built-in photodiode. For example, if a red laser (780 nm/680 nm) is used for the semiconductor device with a built-in photodiode, then the thicknesses of the silicon oxide film 10 and the silicon nitride film 11 are set to about 30 and 55 nm respectively.

As shown in FIG. 6, after the antireflection coating 20 having the above structure is formed, the cathode area n-type diffusion layer 4a and the like are formed in an area in the divided photodiode area 1 where the element is to be formed. In addition, the division section p-type diffusion layer 6b is formed on the p-type buried diffusion layer 5b. The division section 8 is made up of the division section p-type diffusion layer 6b and the p-type buried diffusion layer 5b.

As shown in FIGS. 7, 1, and 2, the antireflection coating 20 in the cathode electrode area 13 and the anode electrode area 34 included in the divided photodiode area 1 is removed. At the same time the whole of the antireflection coating 20 in the MOS transistor area 30 is removed. A gate oxide film 35 with a thickness of about 20 nm is then formed in an area in the MOS transistor area 30 where the element is to be formed. The polycrystalline silicon film 14 with a thickness of about 300 nm is formed on the entire surface. In the divided photodiode area 1, the polycrystalline silicon film 14 is left on the antireflection coating 20 in the light receiving area 12, on the antireflection coating 20 on the division section 8 and its vicinity outside the light receiving area 12, in the cathode electrode area 13, and in the anode electrode area 34. In the MOS transistor area 30, the polycrystalline silicon film 14 is left in a gate electrode area. The polycrystalline silicon film 14 is removed in the other areas in the divided photodiode area 1 and the MOS transistor area 30 by etching.

n-type lightly doped drain (LDD) diffusion layers 36*a* and 36*b* are then formed in the p-type well diffusion layer 32 in the MOS transistor area 30. An insulating film with a thickness of about 300 nm used for forming a sidewall is formed in, at least, the MOS transistor area 30 of the divided photodiode area 1 and the MOS transistor area 30. Reactive ion etching (RIE) is then performed to form a sidewall 37.

When this etching is performed to form the sidewall 37, the antireflection coating 20 in an area which is not covered with the polycrystalline silicon film 14 is apt to be removed because of a difference in etching selectivity. In the first embodiment of the present invention, however, the polycrystalline silicon film 14 is left, as shown in FIGS. 1 and 2, not only on the antireflection coating 20 in the light receiving area 12 but on the antireflection coating 20 on the division section 8 and its vicinity outside the light receiving area 12 at the time of patterning the polycrystalline silicon film 14 formed on the entire surface. Accordingly, the polycrystalline silicon film 14 effectively protects the antireflection coating 20 in the light receiving area 12 against the etching performed for forming the sidewall 37. In addition, as shown in FIG. 3, the polycrystalline silicon film 14 effectively protects the antireflection coating 20 on the division section 8 and its vicinity outside the light receiving area 12 against the etching.

When the sidewall is formed, a photoresist left in the divided photodiode area 1 and the insulating film, such as an oxide film, used for forming the sidewall may be used as protection layers.

Figure 23:
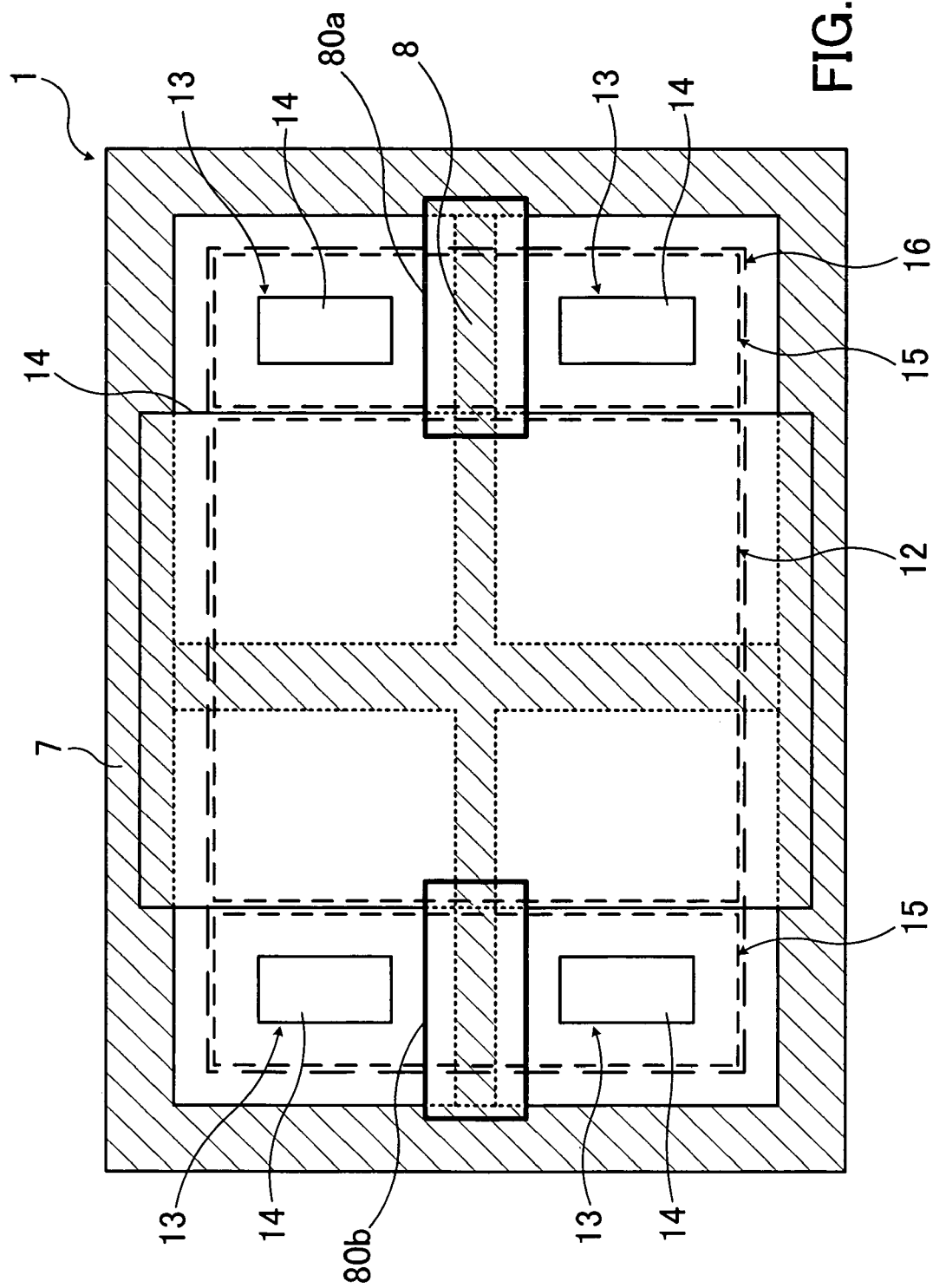
FIG. 23 is a schematic plan view showing an important part of another example of the fourth formation process in the first embodiment of the present invention.
Figure 24:
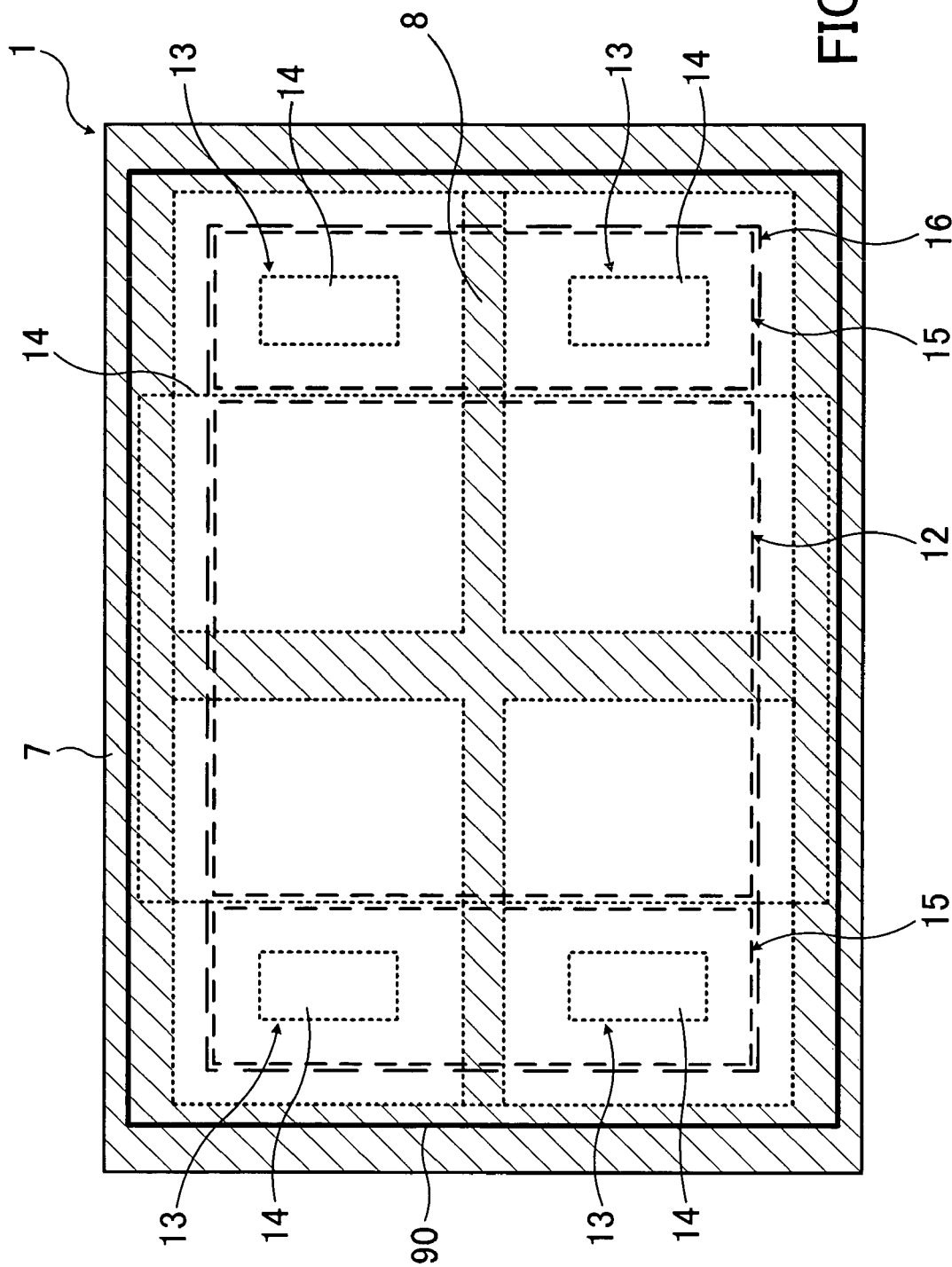
FIG. 24 is a schematic plan view showing the important part of still another example of the fourth formation process in the first embodiment of the present invention.
Figure 25:
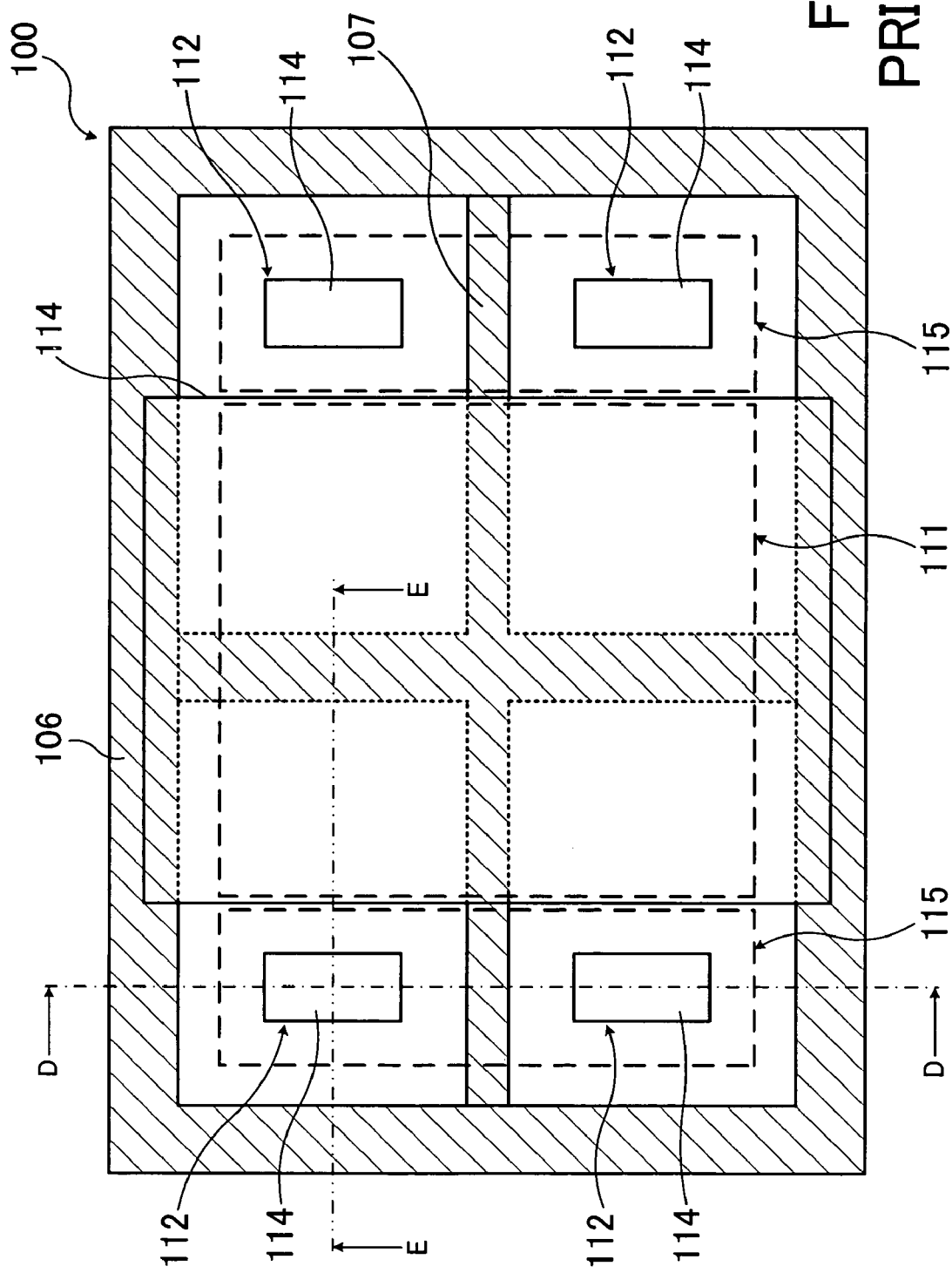
FIG. 25 is a schematic plan view showing an important part of a process for forming a conventional semiconductor device with a built-in photodiode.
Figure 26:
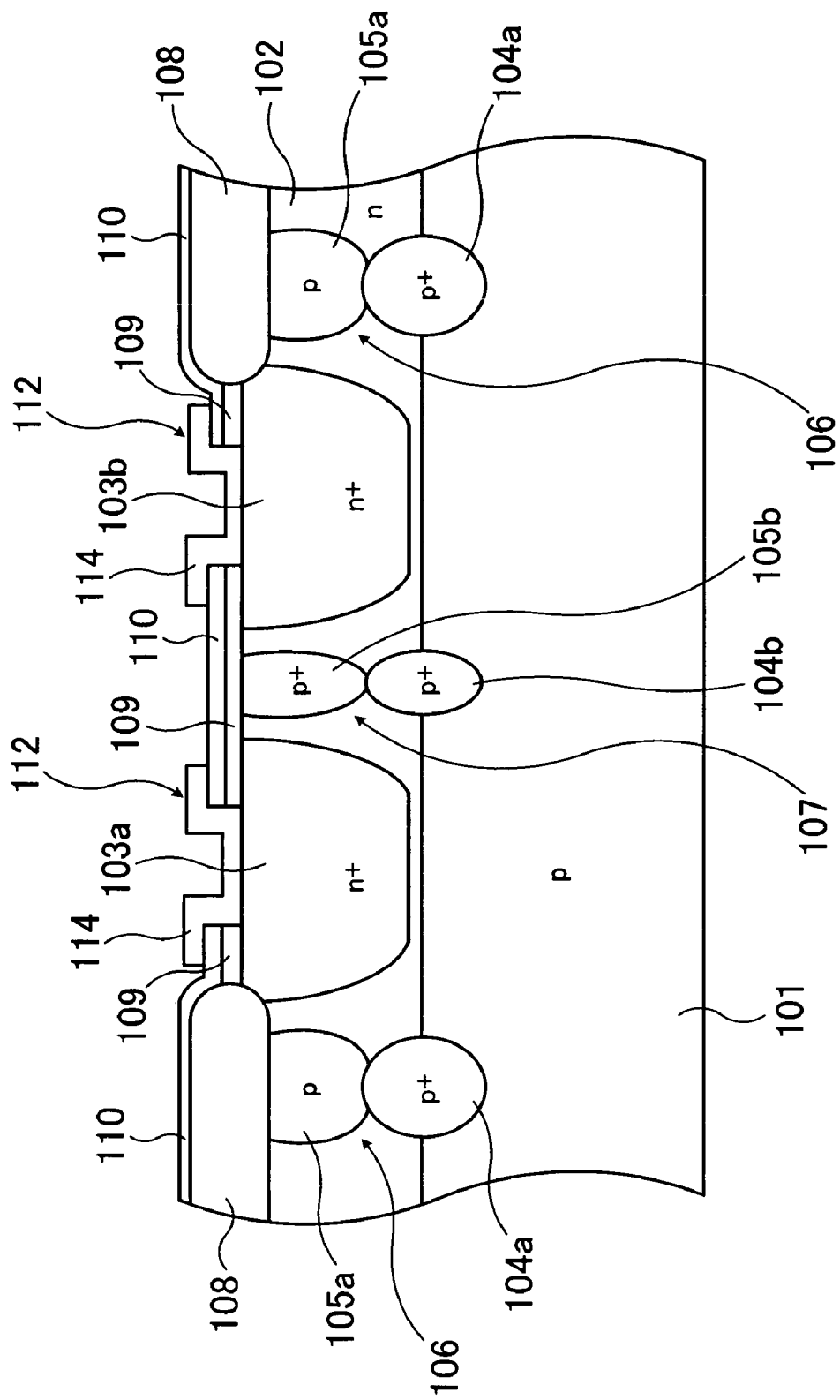
FIG. 26 is a schematic sectional view taken along lines D-D of FIG. 25.
Figure 27:
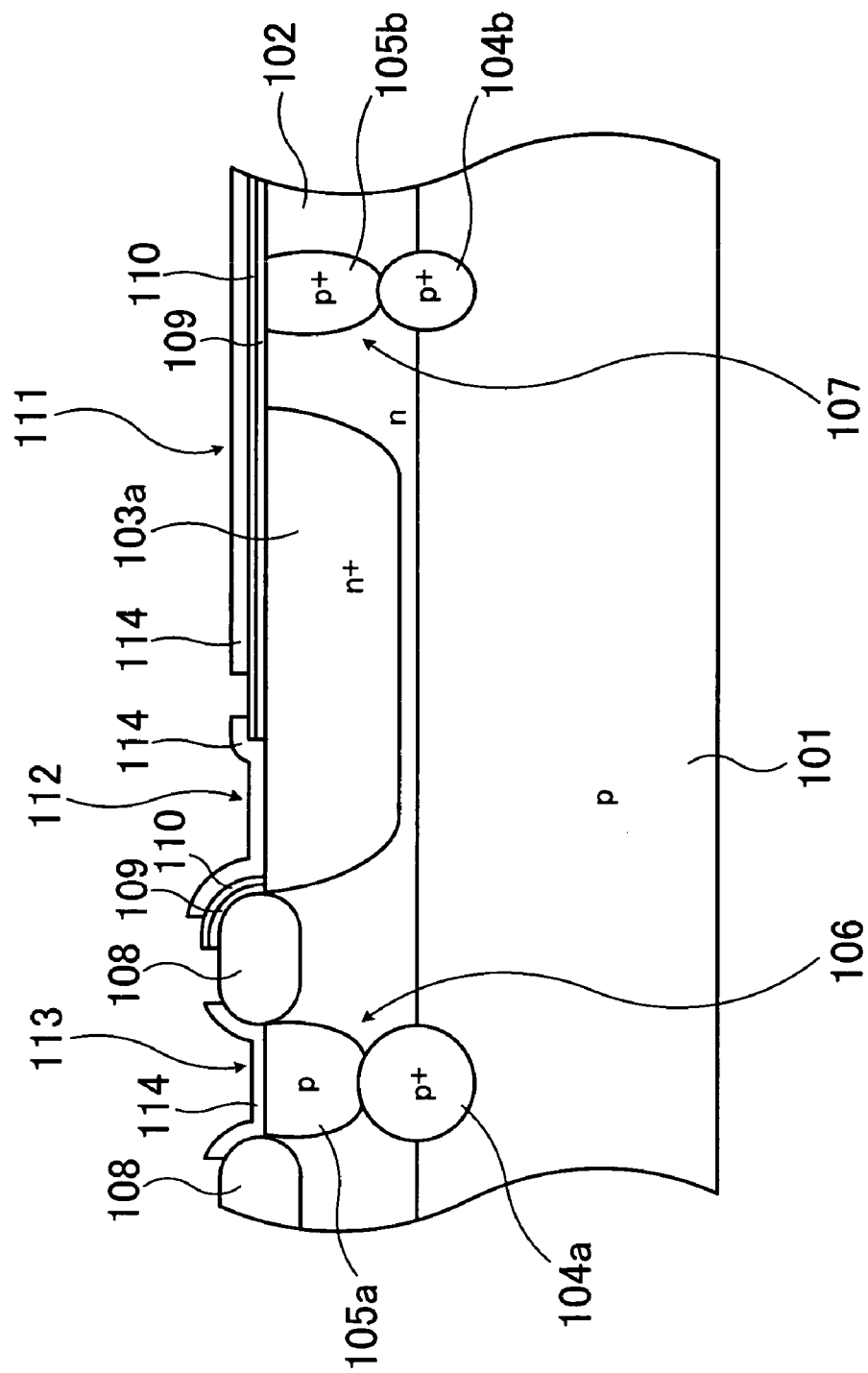
FIG. 27 is a schematic sectional view taken along lines E-E of FIG. 25.
Figure 28:
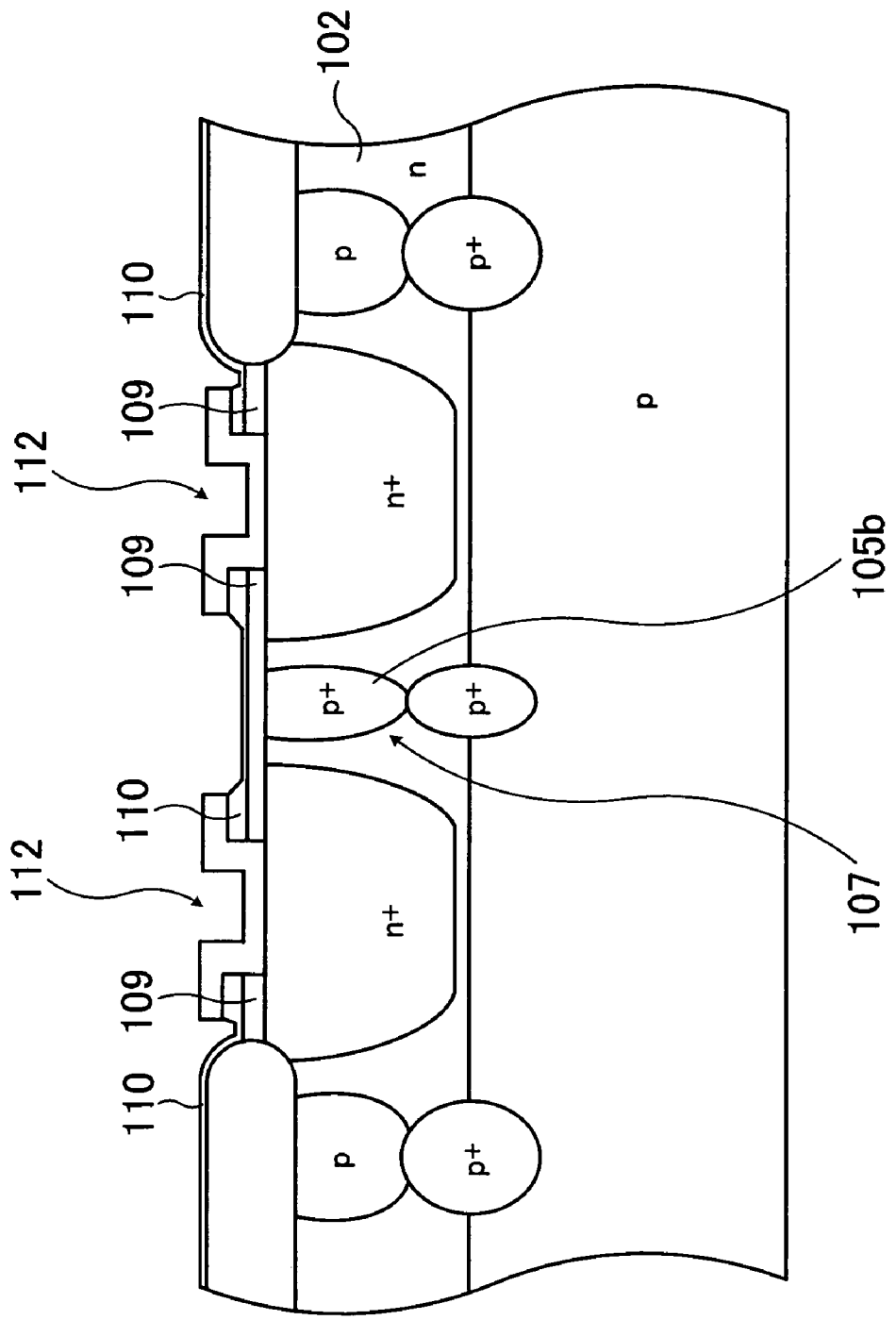
FIG. 28 is a schematic sectional view (No. 1) showing an important part of an etching process.
Figure 29:
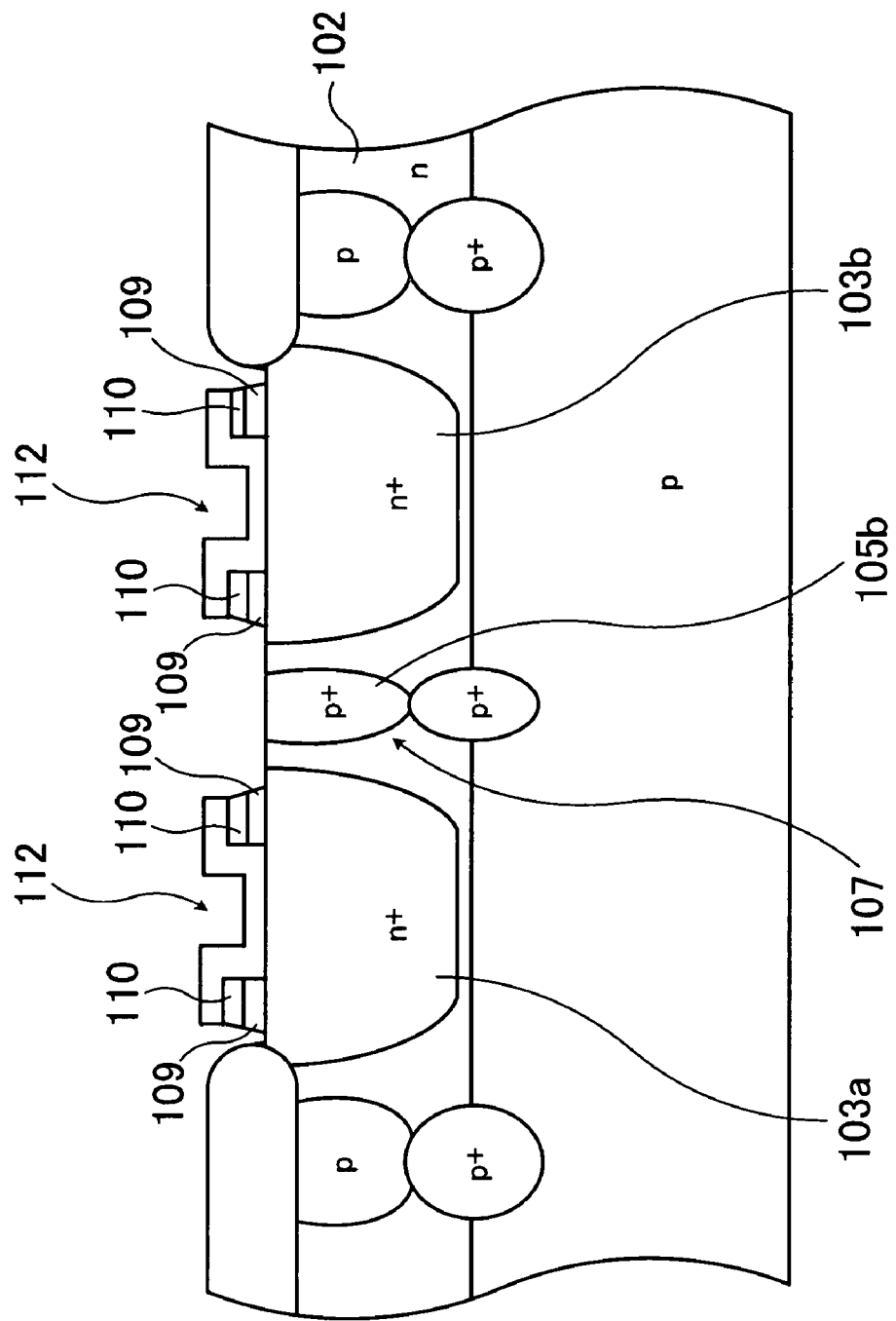
FIG. 29 is a schematic sectional view (No. 2) showing an important part of the etching process.

Each of FIGS. 23 and 24 is a schematic plan view showing an important part of another example of the fourth formation process in the first embodiment of the present invention.

Concrete methods for using the insulating film for forming the sidewall as a protection layer are as follows. As shown in FIG. 23, when the RIE is performed to form the sidewall 37, the antireflection coating 20 in the light receiving area 12 is protected by the polycrystalline silicon film 14 and the division section 8 and its vicinity outside the light receiving area 12 are covered with photoresists 80*a* and 80*b*.

In FIG. 23, the photoresists 80*a* and 80*b* are left on the division section 8 and its vicinity outside the light receiving area 12 which are not covered with the polycrystalline silicon film 14. As shown in FIG. 24, however, a photoresist 90 may be left so as to cover the whole of the divided photodiode area 1.

By using the photoresists 80*a* and 80*b* or the photoresist 90 in this way, the division section 8 and its vicinity outside the light receiving area 12 or the whole of the divided photodiode area 1 is protected against the etching when the RIE is performed to form the sidewall 37. Moreover, by leaving the photoresists 80*a* and 80*b* or the photoresist 90 at the time of forming the sidewall 37, the insulating film for forming the sidewall remains beneath them. This insulating film functions as a protection film against plasma or etching after stripping the photoresists 80*a* and 80*b* or the photoresist 90 in the fabrication process.

The above effect of protecting the division section 8 and its vicinity outside the light receiving area 12 against the etching or the like by leaving the polycrystalline silicon film 14 on them can also be obtained at the time of patterning the polycrystalline silicon film 14 before forming the sidewall 37. That is to say, at the time of patterning the polycrystalline silicon film 14, the antireflection coating 20 which gets exposed after removing the polycrystalline silicon film 14 is apt to be over-etched. If such over-etching occurs in the division section 8, a leakage current may flow due to a drop in impurity concentration or etching damage. By forming the polycrystalline silicon film 14 on the antireflection coating 20 in the light receiving area 12 and on the antireflection coating 20 on the division section 8 and its vicinity outside the light receiving area 12, however, the antireflection coating 20 on the division section 8 and its vicinity is effectively protected against the etching.

As shown in FIG. 8, after the sidewall 37 is formed, n-type source/drain diffusion layers 38*a* and 38*b* and a p-type back gate diffusion layer 38*c* are formed in the p-type well diffusion layer 32. A wiring interlayer film 39 is then formed on the entire surface. As shown in FIG. 9, contact holes which reach the polycrystalline silicon film 14 in the cathode electrode area 13 and the anode electrode area 34 in the divided photodiode area 1 and the source/drain diffusion layers 38*a* and 38*b*, the back gate diffusion layer 38*c*, and a gate (not shown) in the MOS transistor area 30 are made in the wiring interlayer film 39 and the gate oxide film 35 and metal electrodes 40*a*, 40*b*, 40*c*, 40*d*, and 40*e* are formed in the contact holes respectively.

As shown in FIG. 10, finally a wiring interlayer film 41 and a cover film 42 are formed and, for example, the formation of an opening is performed in a pad area (not shown) In addition, the cover film 42 and the wiring interlayer films 41 and 39 on the light receiving area 12 and the division section 8 and its vicinity outside the light receiving area 12 are removed by dry etching with the polycrystalline silicon film 14 as an etching stopper. The polycrystalline silicon film 14 which gets exposed as a result of the dry etching is removed by wet etching. In this case, the antireflection coating 20 functions as a protection layer in the light receiving area 12 and on the division section 8 and its vicinity outside the light receiving area 12 and protects these areas against the wet etching. As a result, the antireflection coating 20 remains on the division section 8 and its vicinity outside the light receiving area 12.

The fundamental structure of the semiconductor device with a built-in photodiode including the CMOS transistor has now been completed.

In FIGS. 9 and 10, a single-layer wiring structure is shown. However, it is a matter of course that a multilayer wiring structure may be adopted.

In the above descriptions, the CMOS transistor included in the semiconductor device with a built-in photodiode is an n-channel MOS transistor. However, a p-channel MOS transistor, together with the n-channel MOS transistor and the photodiode, can be formed on the p-type silicon substrate 2 in the same way.

A second embodiment of the present invention will now be described.

In the above first embodiment of the present invention, the descriptions have been given with the semiconductor device including the photodiode and the CMOS transistor as an example. In the second embodiment of the present invention, however, the case where a bipolar transistor is formed in place of the CMOS transistor will be described. As shown in FIGS. 1 through 3, a polycrystalline silicon film 14 is formed on an antireflection coating 20 in a light receiving area 12 in a divided photodiode area 1 and on the antireflection coating 20 on a division section 8 and its vicinity outside the light receiving area 12 in the divided photodiode area 1 even if a bipolar transistor is formed in place of the CMOS transistor. By doing so, these areas can effectively be protected against etching or the like performed in a semiconductor device formation process.

A method for forming a semiconductor device with a built-in photodiode, according to the second embodiment of the present invention will now be described in detail with reference to FIGS. 11 through 19 and 1 through 3. In the following descriptions, an npn transistor is taken as an example of a bipolar transistor.

Figure 11:
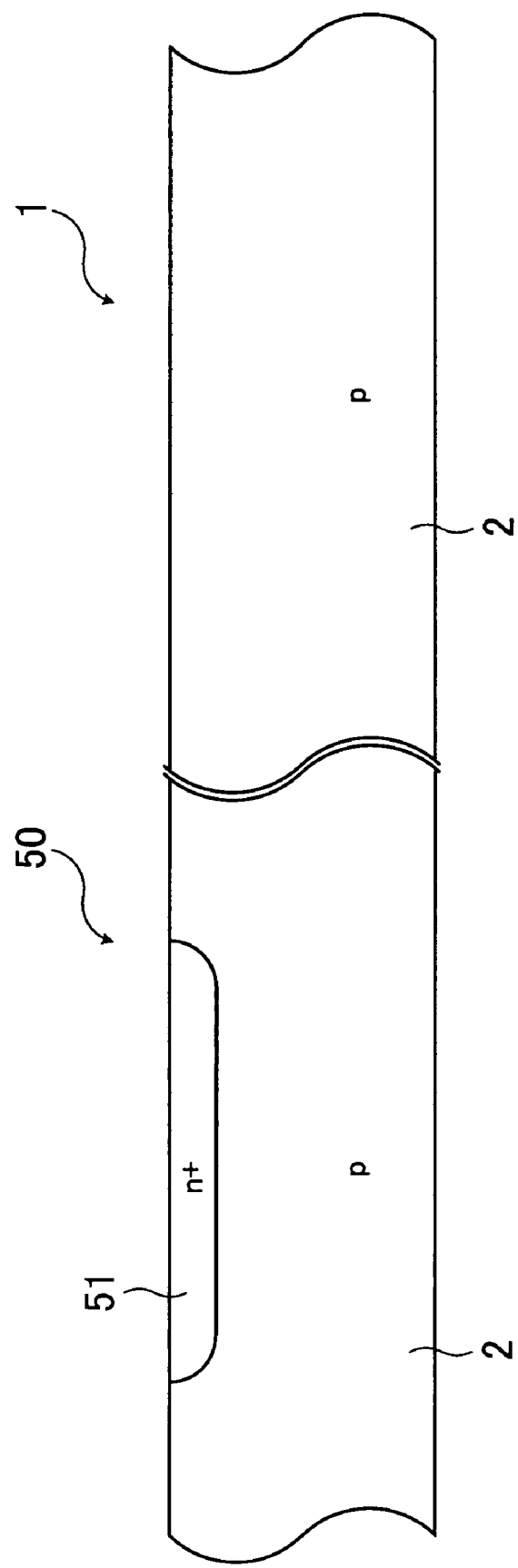
FIG. 11 is a schematic sectional view showing an important part of a first formation process in a second embodiment of the present invention.
Figure 12:
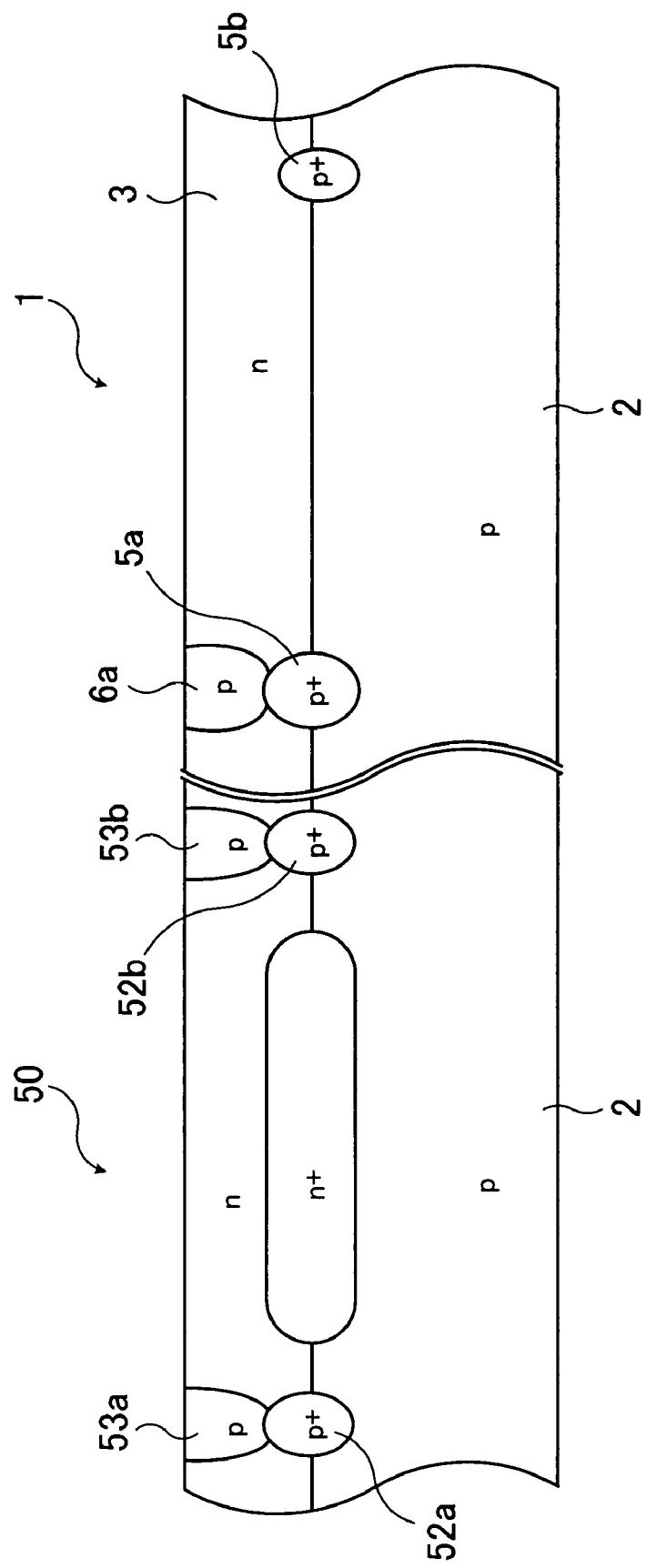
FIG. 12 is a schematic sectional view showing an important part of a second formation process in the second embodiment of the present invention.
Figure 13:
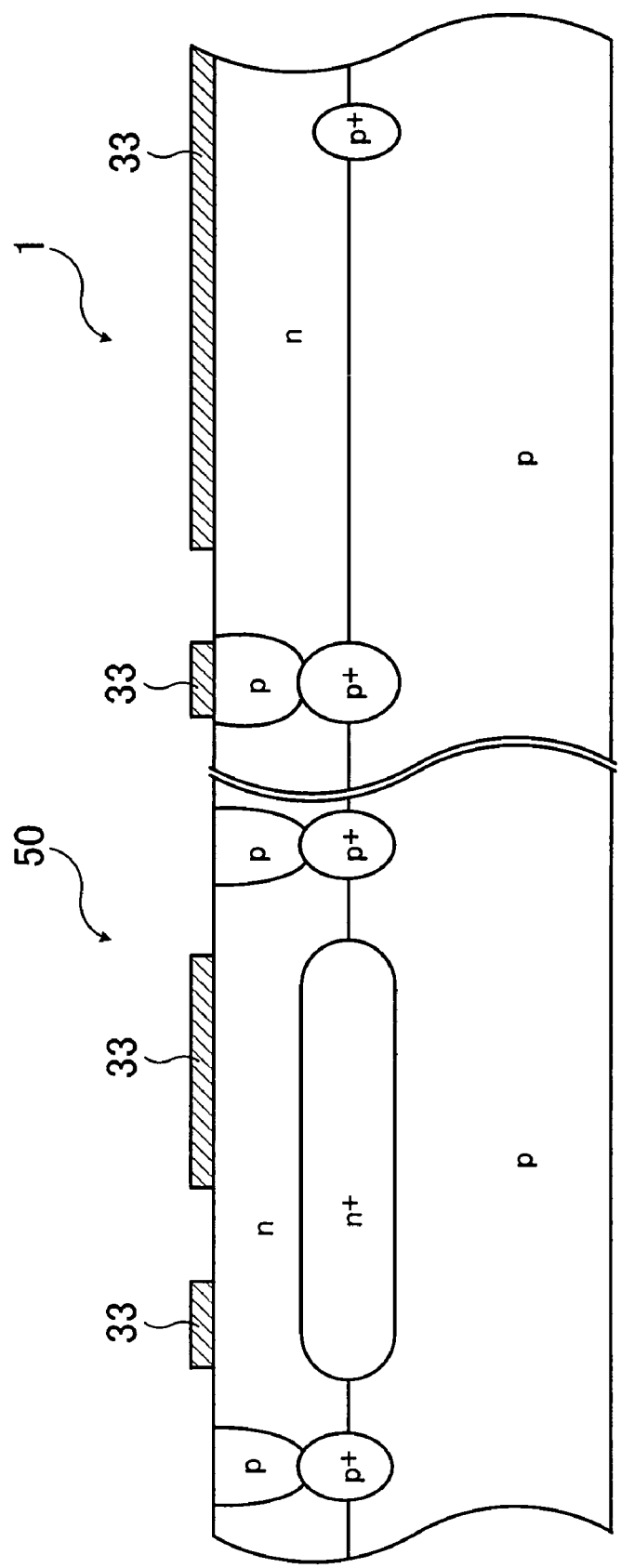
FIG. 13 is a schematic sectional view showing an important part of a third formation process in the second embodiment of the present invention.
Figure 14:
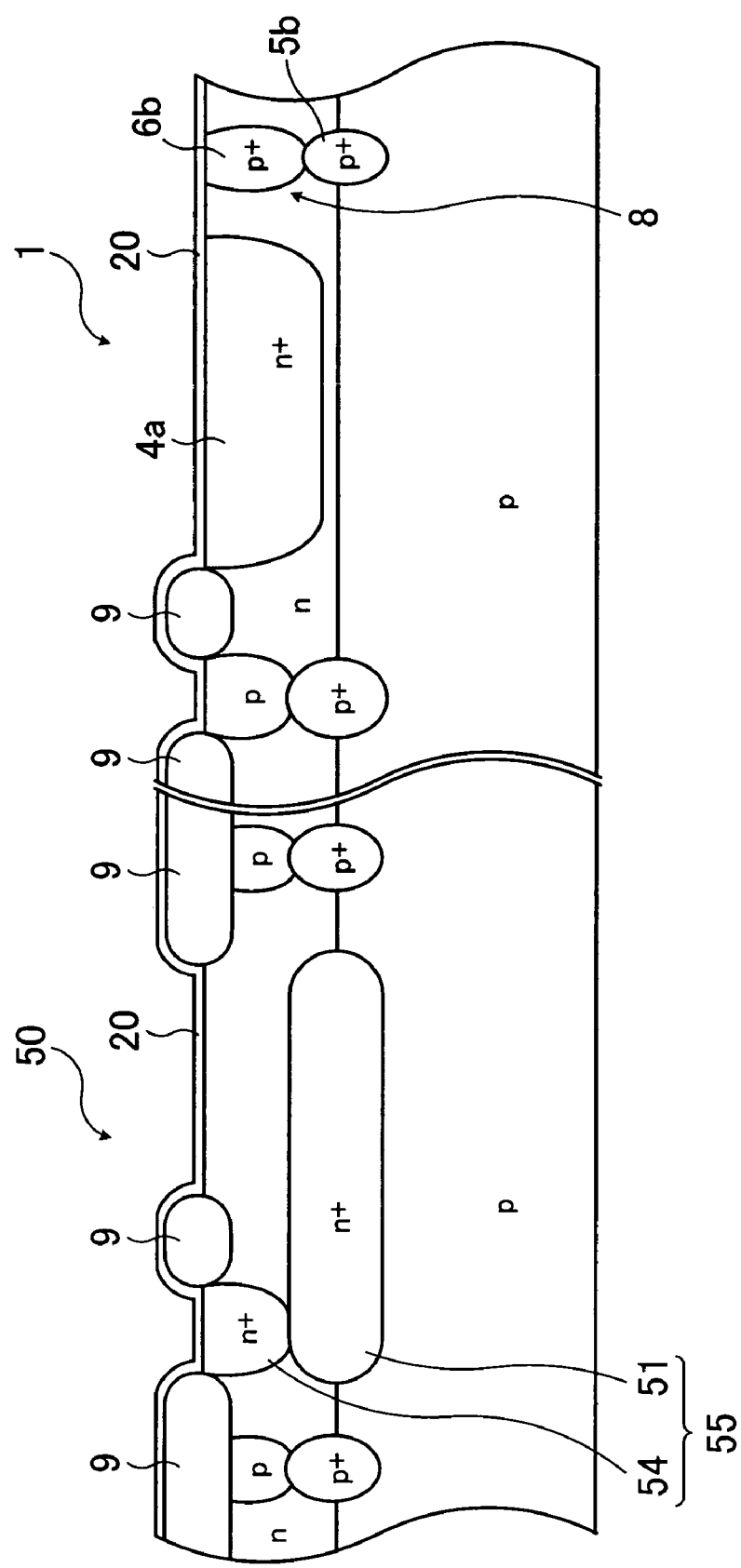
FIG. 14 is a schematic sectional view showing an important part of a fourth formation process in the second embodiment of the present invention.
Figure 15:
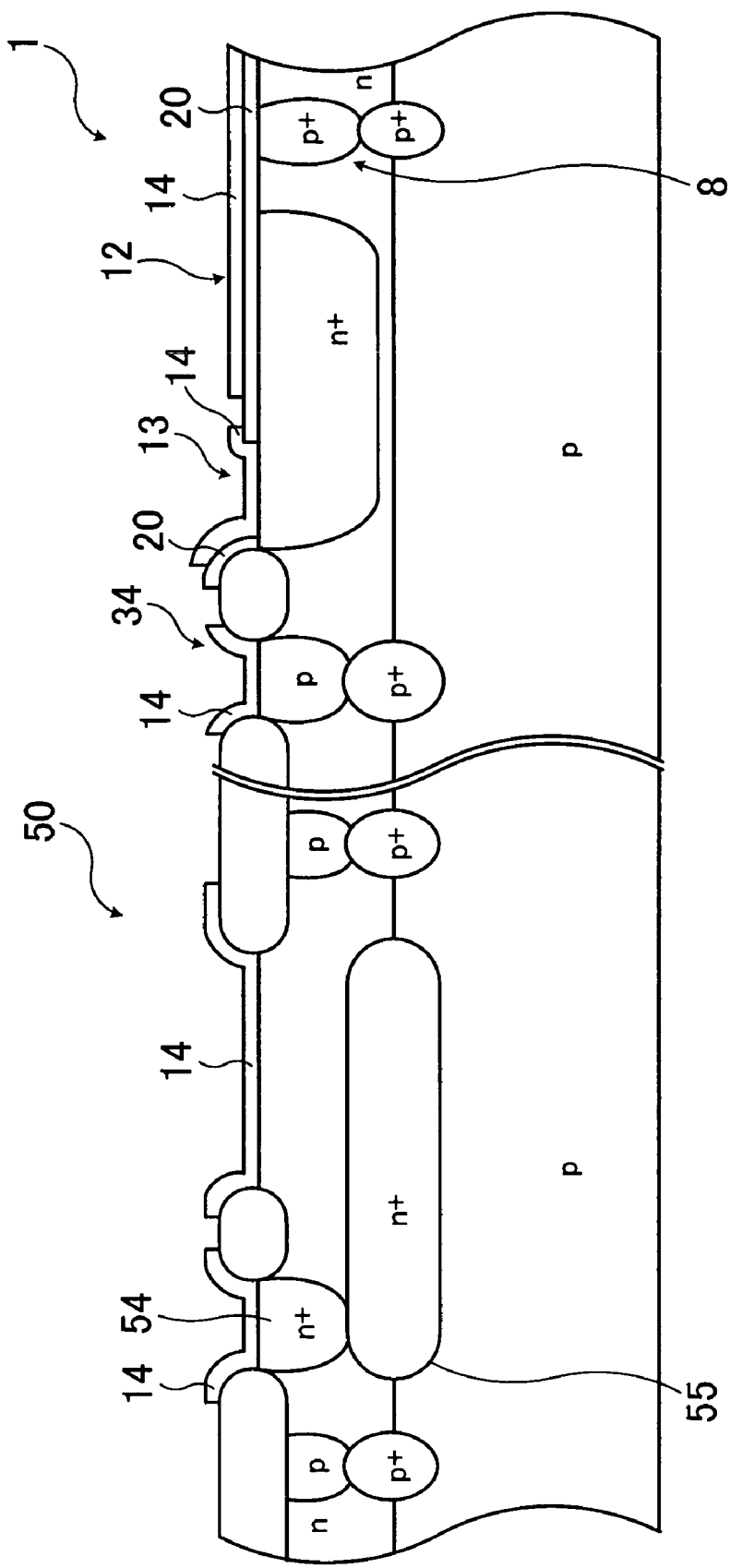
FIG. 15 is a schematic sectional view showing an important part of a fifth formation process in the second embodiment of the present invention.
Figure 16:
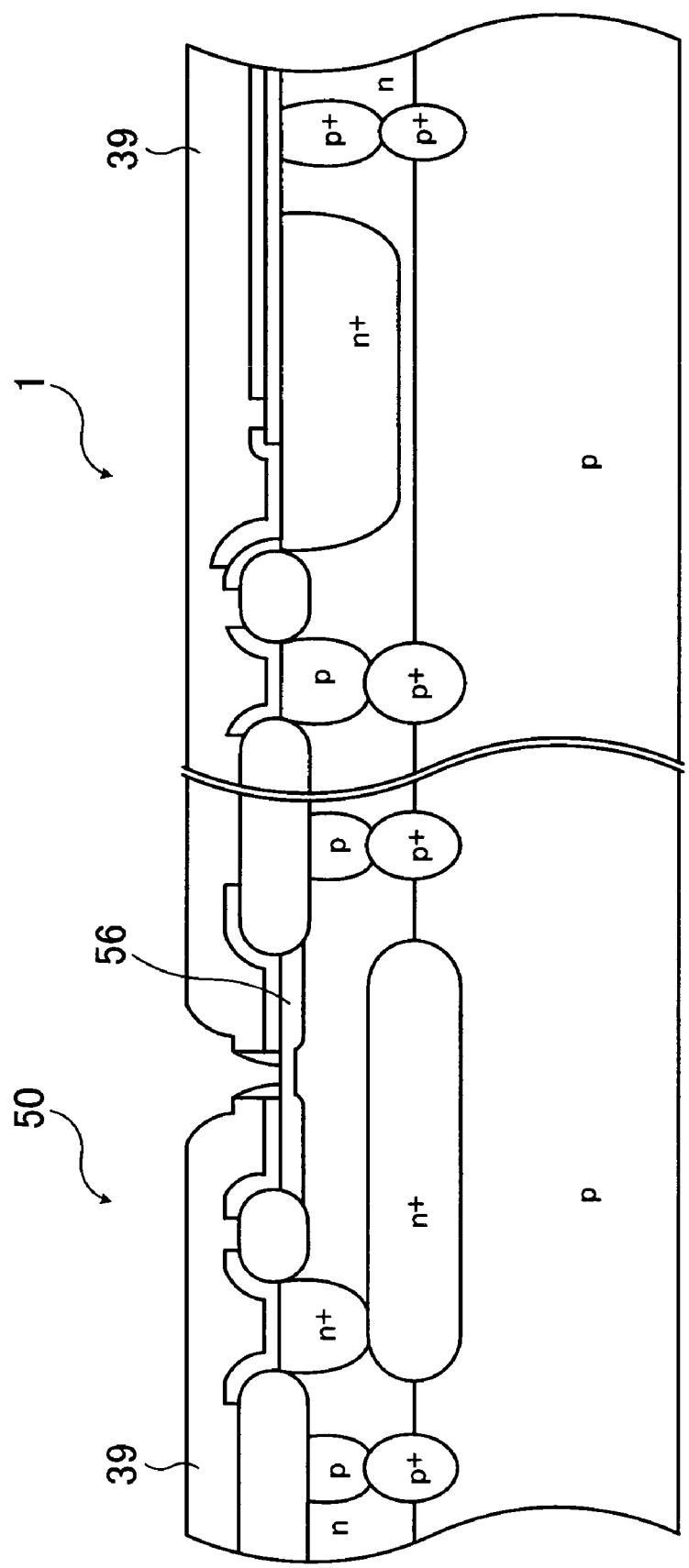
FIG. 16 is a schematic sectional view showing an important part of a sixth formation process in the second embodiment of the present invention.
Figure 17:
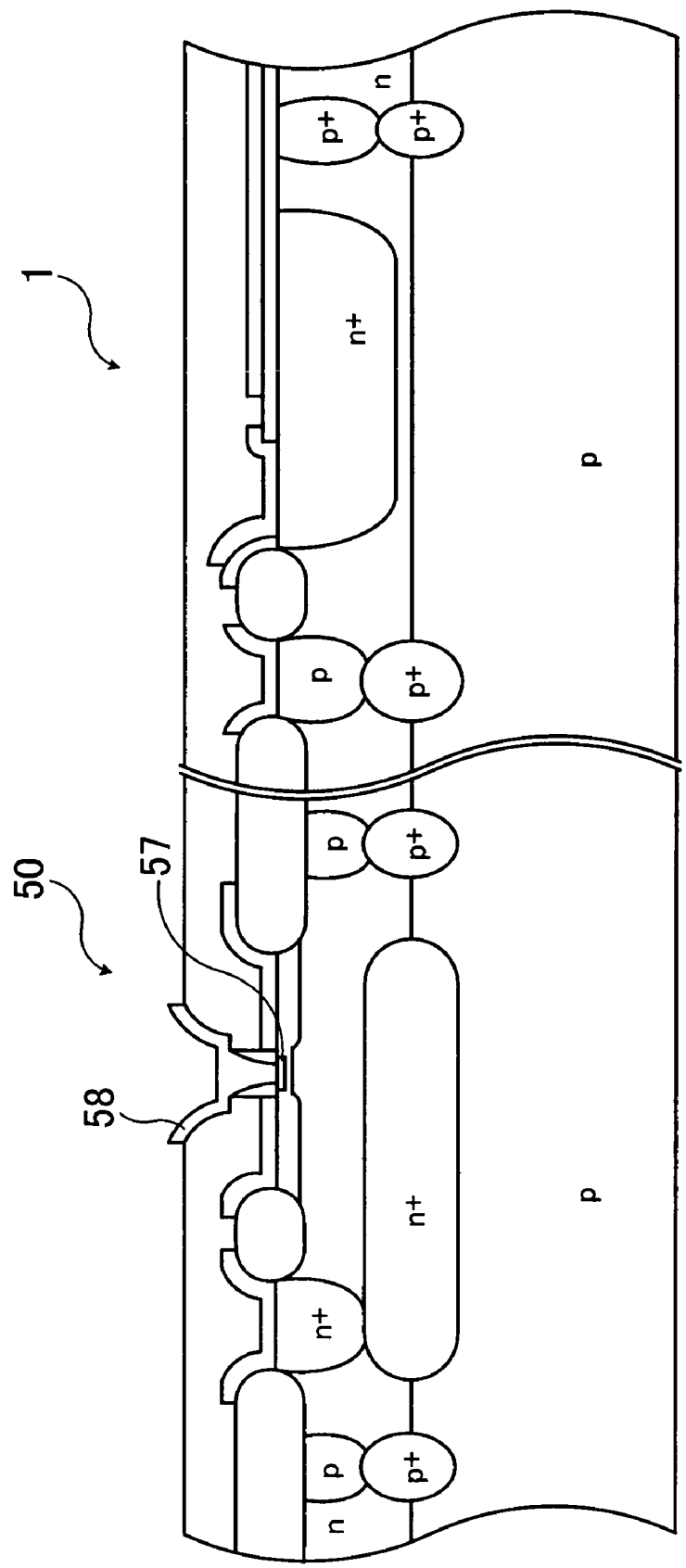
FIG. 17 is a schematic sectional view showing an important part of a seventh formation process in the second embodiment of the present invention.
Figure 18:
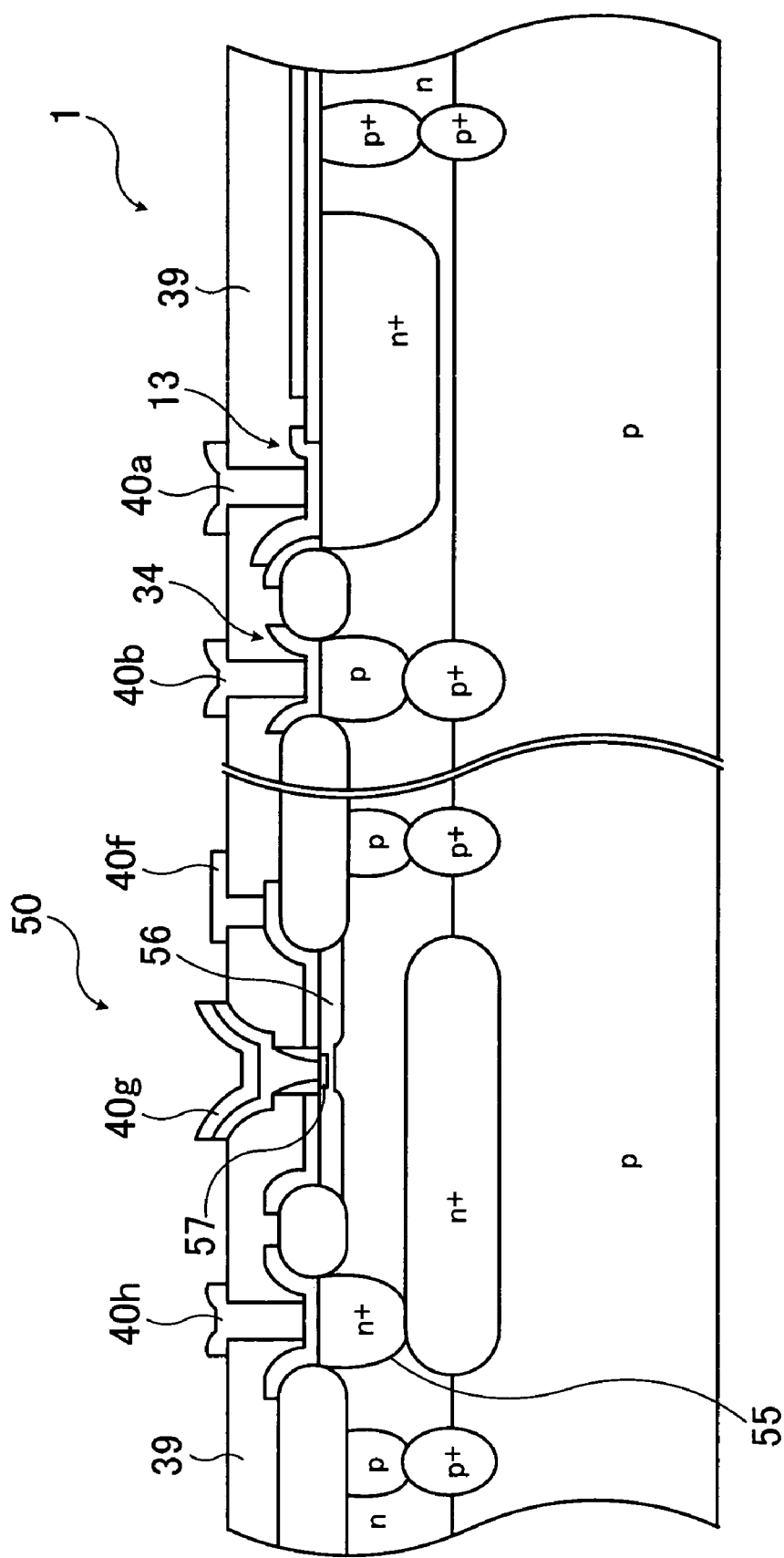
FIG. 18 is a schematic sectional view showing an important part of an eighth formation process in the second embodiment of the present invention.
Figure 19:
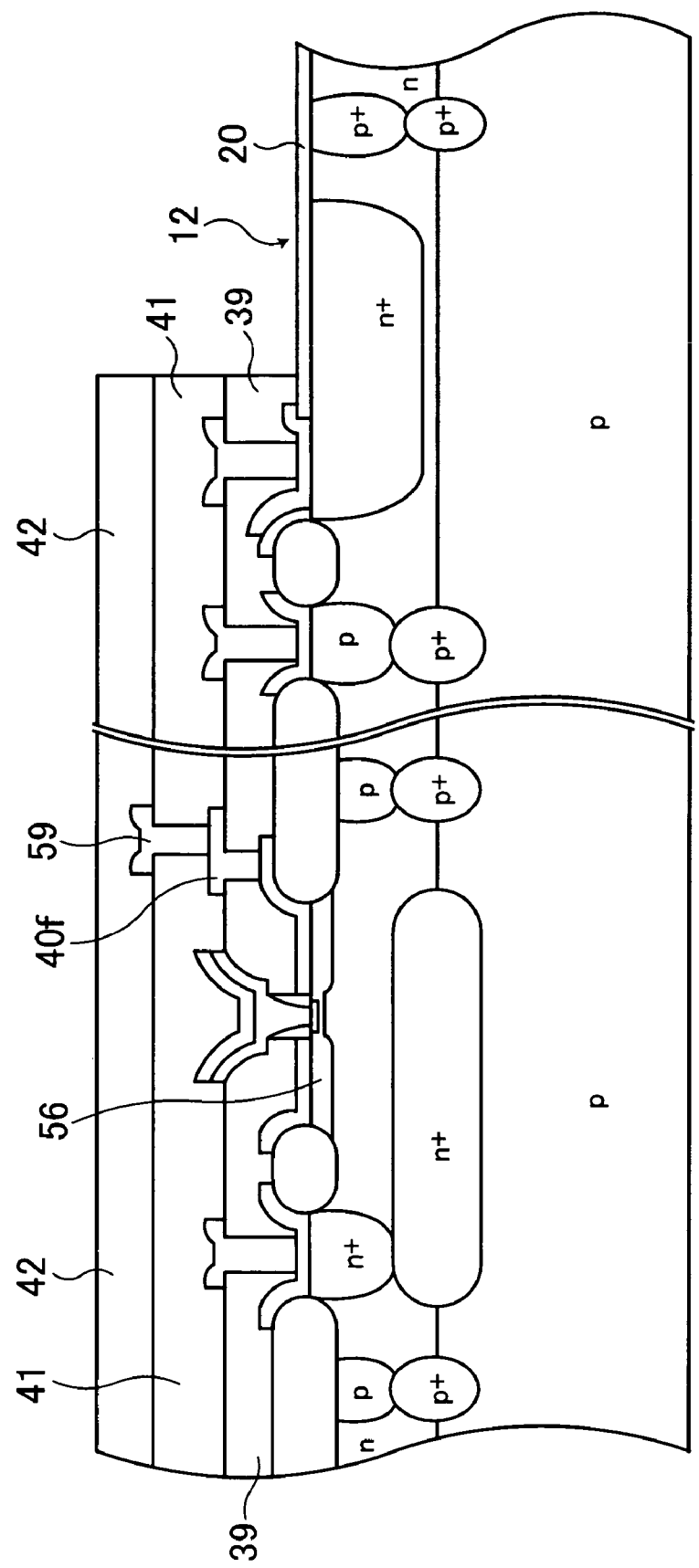
FIG. 19 is a schematic sectional view showing an important part of a ninth formation process in the second embodiment of the present invention.

FIG. 11 is a schematic sectional view showing an important part of a first formation process in the second embodiment of the present invention. FIG. 12 is a schematic sectional view showing an important part of a second formation process in the second embodiment of the present invention. FIG. 13 is a schematic sectional view showing an important part of a third formation process in the second embodiment of the present invention. FIG. 14 is a schematic sectional view showing an important part of a fourth formation process in the second embodiment of the present invention. FIG. 15 is a schematic sectional view showing an important part of a fifth formation process in the second embodiment of the present invention. FIG. 16 is a schematic sectional view showing an important part of a sixth formation process in the second embodiment of the present invention. FIG. 17 is a schematic sectional view showing an important part of a seventh formation process in the second embodiment of the present invention. FIG. 18 is a schematic sectional view showing an important part of an eighth formation process in the second embodiment of the present invention. FIG. 19 is a schematic sectional view showing an important part of a ninth formation process in the second embodiment of the present invention. The sectional views of FIGS. 11 through 19 showing the divided photodiode area 1 are taken along lines B-B of FIG. 1. Components in FIGS. 11 through 19 that are the same as or equivalent to those shown in FIGS. 1 through 10 are marked with the same symbols and detailed descriptions of them will be omitted.

As shown in FIG. 11, an n-type buried diffusion layer 51 is formed first in a predetermined position in an area (npn transistor area) 50 in a p-type silicon substrate 2 where an npn transistor is to be formed. The n-type buried diffusion layer 51 finally forms part of a collector layer 55 of the npn transistor.

As shown in FIG. 12, p-type buried diffusion layers 5a and 5b and p-type buried diffusion layers 52a and 52b are then formed in predetermined positions in the divided photodiode area 1 and the npn transistor area 50, respectively, on the p-type silicon substrate 2. An n-type epitaxial layer 3 and a silicon oxide film (not shown), being a pad oxide film, are formed on the entire surface. A p-type well diffusion layer 6a and p-type well diffusion layers 53a and 53b are formed in predetermined positions in the divided photodiode area 1 and the npn transistor area 50, respectively.

As shown in FIG. 13, after the p-type well diffusion layers 6a, 53a, and 53b are formed, a silicon nitride mask 33 is formed to form a silicon oxide film by the LOCOS method. As shown in FIG. 14, a silicon oxide film 9 is formed by using the mask 33. The mask 33 and the pad oxide film are then removed. A silicon oxide film 10 with predetermined thickness and a silicon nitride film 11 with predetermined thickness are formed in order on the entire surface to form the antireflection coating 20 made up of two layers of the silicon oxide film 10 and the silicon nitride film 11. After the antireflection coating 20 is formed, a cathode area n-type diffusion layer 4a and the like are formed in the divided photodiode area 1 and an n-type diffusion layer 54 is formed in the npn transistor area 50. As a result, the collector layer 55 is formed in the npn transistor area 50 by the n-type diffusion layer 54 and the n-type buried diffusion layer 51 previously formed. In addition, a division section p-type diffusion layer 6b is formed on the p-type buried diffusion layer 5b to form a division section 8.

As shown in FIGS. 15, 1, and 2, the antireflection coating 20 in a cathode electrode area 13 and an anode electrode area 34 in the divided photodiode area 1 is removed and the whole of the antireflection coating 20 in the npn transistor area 50 is removed.

The polycrystalline silicon film 14 is formed on the entire surface. In the divided photodiode area 1, as shown in FIG. 15, the polycrystalline silicon film 14 is left on the antireflection coating 20 in the light receiving area 12, on the antireflection coating 20 on the division section 8 and its vicinity outside the light receiving area 12, in the cathode electrode area 13, and in the anode electrode area 34 and the polycrystalline silicon film 14 in the other areas is removed by etching. In the npn transistor area 50, the polycrystalline silicon film 14 is left on the collector layer 55, that is to say, on the n-type diffusion layer 54, and in areas where a base layer 56 and an emitter layer 57 is to be formed, and the polycrystalline silicon film 14 in the other areas is removed by etching.

When the polycrystalline silicon film 14 is patterned in this way, the antireflection coating 20 which gets exposed after the removal of the polycrystalline silicon film 14 is apt to be over-etched because of the difference in etching selectivity between polycrystalline silicon and silicon nitride. As a result, the silicon nitride film 11 included in the antireflection coating 20 may be removed or even the silicon oxide film 10 beneath it may be removed. If this occurs in the division section 8, a leakage current may flow due to a drop in impurity concentration or etching damage.

As shown in FIGS. 1 and 2, in the second embodiment of the present invention, however, the polycrystalline silicon film 14 is formed on the antireflection coating 20 in the light receiving area 12 and on the antireflection coating 20 on the division section 8 and its vicinity outside the light receiving area 12. This is the same with the above first embodiment of the present invention. Therefore, the antireflection coating 20 in the light receiving area 12 is effectively protected against etching performed at the time of patterning the polycrystalline silicon film 14, and, as shown in FIG. 3, the antireflection coating 20 on the division section 8 and its vicinity outside the light receiving area 12 is also protected effectively against the etching.

As shown in FIG. 16, after the polycrystalline silicon film 14 is patterned, the base layer 56 is formed in the npn transistor area 50. A wiring interlayer film 39 is formed on the entire surface and contact holes are formed in predetermined positions in the wiring interlayer film 39. As shown in FIG. 17, the emitter layer 57 and an emitter electrode 58 are formed by using polycrystalline silicon. After that, as shown in FIG. 18, contact holes which reach the cathode electrode area 13 and the anode electrode area 34 in the divided photodiode area 1 and the base layer 56, the emitter layer 57, and the collector layer 55 in the npn transistor area 50 are made in the wiring interlayer film 39 and metal electrodes 40a, 40b, 40f, 40g, and 40h are formed in the contact holes respectively.

As shown in FIG. 19, finally a wiring interlayer film 41 is formed and a contact hole which reaches the metal electrode 40f connected to the base layer 56 to form a second-layer metal electrode 59. A cover film 42 is then formed as an uppermost layer. For example, the formation of an opening is performed in a pad area (not shown). In addition, the cover film 42 and the wiring interlayer films 41 and 39 on the light receiving area 12 and the division section 8 and its vicinity outside the light receiving area 12 are removed by dry etching with the polycrystalline silicon film 14 as an etching stopper.

The polycrystalline silicon film 14 which gets exposed as a result of the dry etching is removed by wet etching. After the wet etching is performed, the antireflection coating 20 remains on the division section 8 and its vicinity outside the light receiving area 12.

The fundamental structure of the semiconductor device with a built-in photodiode including the npn transistor has now been completed.

In FIG. 19, a multilayer wiring structure is shown. However, it is a matter of course that a single-layer wiring structure may be adopted.

In the above descriptions, the bipolar transistor included in the semiconductor device with a built-in photodiode is an npn transistor. However, a pnp transistor, together with the photodiode, can be formed on the p-type silicon substrate 2 in the same way.

A third embodiment of the present invention will now be described.

Figure 20:
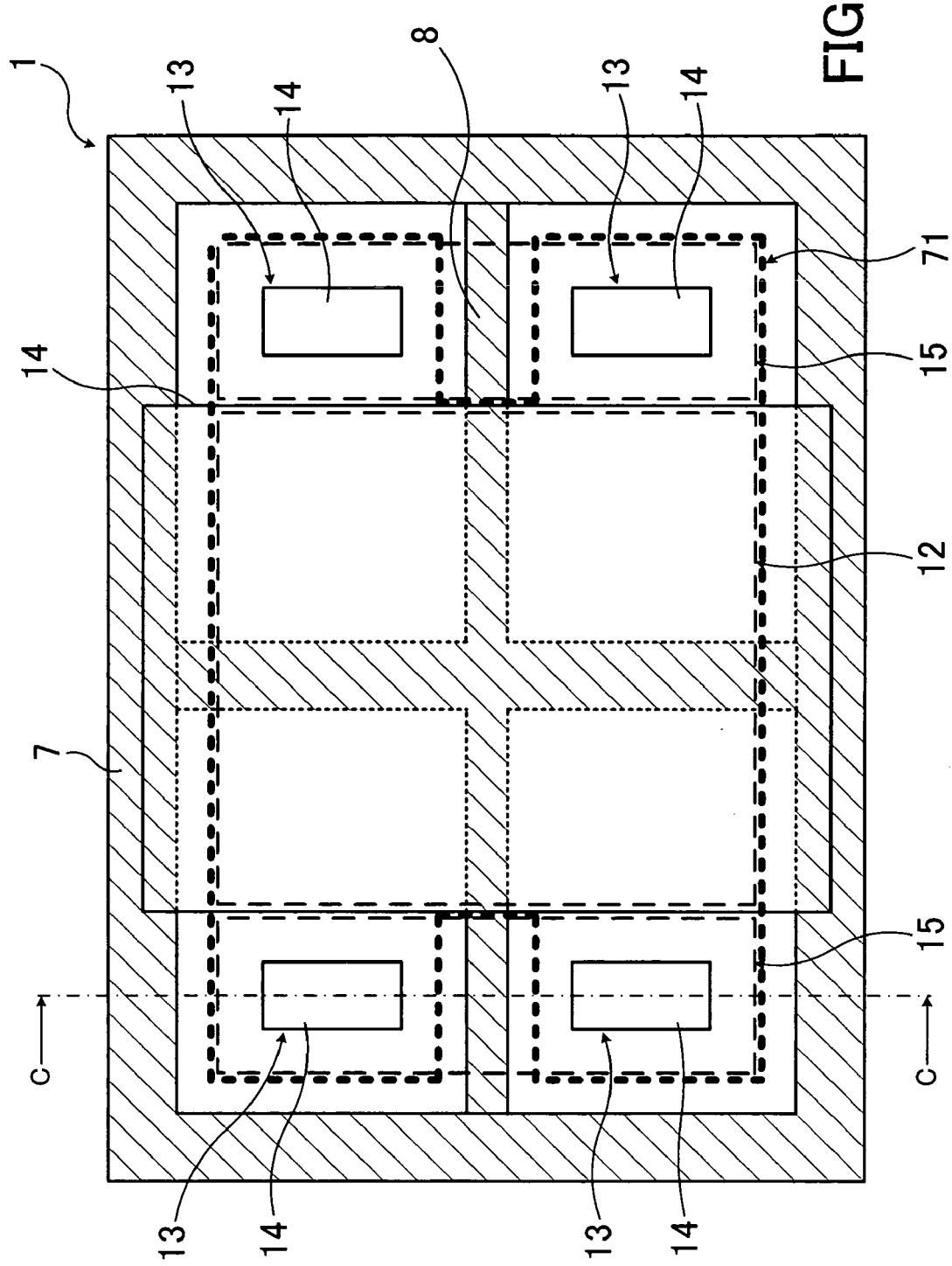
FIG. 20 is a schematic plan view showing an important part of a method for forming a semiconductor device with a built-in photodiode, according to a third embodiment of the present invention.
Figure 21:
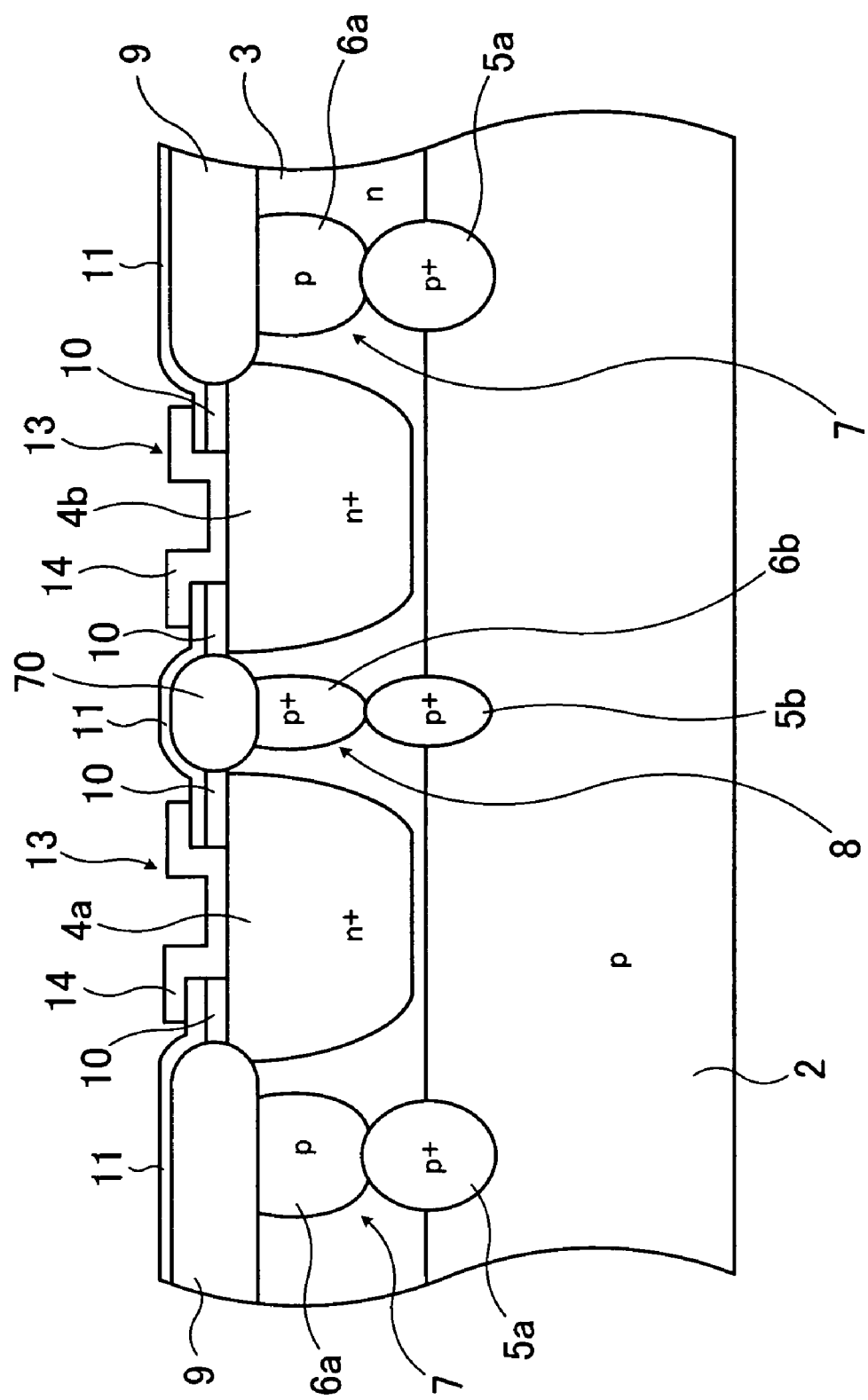
FIG. 21 is a schematic sectional view taken along lines C-C of FIG. 20.

FIG. 20 is a schematic plan view showing an important part of a method for forming a semiconductor device with a built-in photodiode, according to a third embodiment of the present invention. FIG. 21 is a schematic sectional view taken along lines C-C of FIG. 20. Components in FIGS. 20 and 21 that are the same as those shown in FIGS. 1 and 2 are marked with the same symbols and detailed descriptions of them will be omitted.

With a semiconductor device with a built-in photodiode according to the third embodiment of the present invention, as shown in FIG. 21, a thick silicon oxide film 70 is formed on a division section 8, which is made up of a p-type buried diffusion layer 5b and a division section p-type diffusion layer 6b between cathode area n-type diffusion layers 4a and 4b, and its vicinity. The semiconductor device with a built-in photodiode according to the third embodiment of the present invention differs from the semiconductor devices with a built-in photodiode according to the above first and second embodiments of the present invention in this respect. The silicon oxide film 70, together with a silicon oxide film 9 formed on an isolation section 7, can be formed by the LOCOS method.

In this case, the same way that was described in FIGS. 4 and 5 (first embodiment of the present invention) or FIGS. 11 through 13 (second embodiment of the present invention) is used. First, a p-type buried diffusion layer 5a, the a p-type buried diffusion layer 5b, an n-type epitaxial layer 3, a p-type well diffusion layer 6a, and the division section p-type diffusion layer 6b are formed on a p-type silicon substrate 2. As a result, the isolation section 7 and the division section 8 are formed. A silicon nitride mask is then formed in, for example, an area 71 shown in FIG. 20. By forming the mask in the area 71 before oxidation and performing the oxidation under predetermined conditions, the thick silicon oxide film 70 can be formed on the division section 8 and its vicinity outside a light receiving area 12 simultaneously with the silicon oxide film 9 on the isolation section 7.

After the silicon oxide film 70 is formed, an antireflection coating 20, a polycrystalline silicon film 14, etc. should be formed by the same processes that were described in FIGS. 6 through 10 (first embodiment of the present invention) or FIGS. 14 through 19 (second embodiment of the present invention) to complete the fundamental structure of the semiconductor device with a built-in photodiode. In this case, the polycrystalline silicon film 14 is formed on the antireflection coating 20 in the light receiving area 12, but the polycrystalline silicon film 14 need not be formed on the antireflection coating 20 on the division section 8 and its vicinity.

Figure 22:
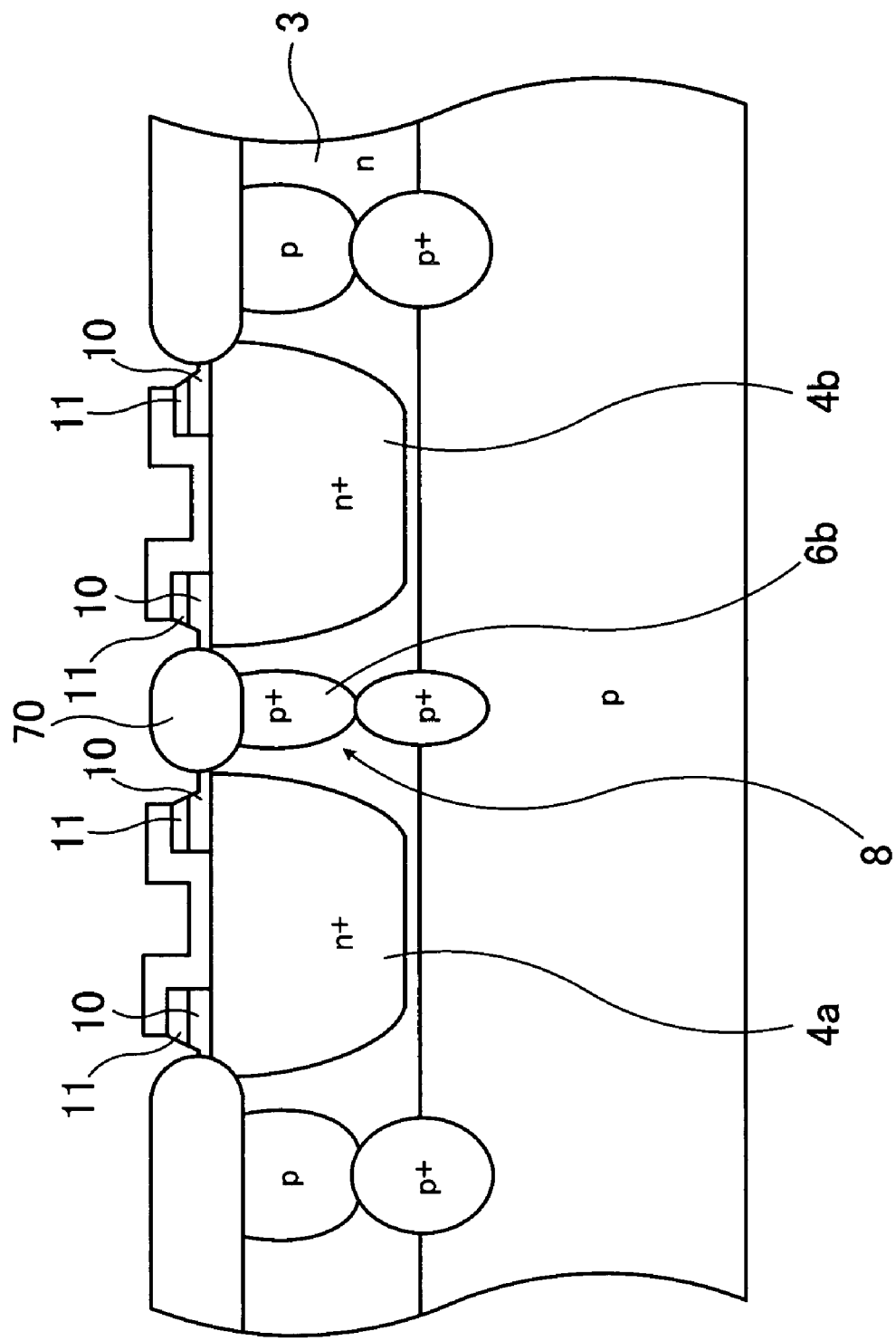
FIG. 22 is a schematic sectional view of an important part showing a state after an etching process in the third embodiment of the present invention.

FIG. 22 is a schematic sectional view of an important part showing a state after an etching process in the third embodiment of the present invention. FIG. 22 is a sectional view showing the state of the semiconductor device after the etching and taken along lines C-C of FIG. 20.

Even if the polycrystalline silicon film 14 is not formed over the division section 8 and its vicinity outside the light receiving area 12, the thick silicon oxide film 70 is formed on the division section 8 and its vicinity outside the light receiving area 12. Therefore, even if etching is performed in the state shown in, for example, FIG. 21, the division section 8 and its vicinity outside the light receiving area 12 are protected against the etching by the silicon oxide film 70 as shown in FIG. 22. In addition, the silicon oxide film 70 remains on the division section 8 and its vicinity outside the light receiving area 12 after the etching. Accordingly, the division section 8 and its vicinity outside the light receiving area 12 are not directly damaged by the etching.

As a result, a drop in impurity concentration or the appearance of a crystal defect in the surface area of the substrate can be prevented. This effectively suppresses a leakage current. Therefore, it is possible to form a high-performance high-quality semiconductor device with a built-in photodiode without deteriorating the characteristics of the photodiode.

In the first through third embodiments of the present invention the n-type epitaxial layer is formed. However, if the conductive type, the type, or the concentration of impurities with which each element is doped is controlled as occasion arises, a p-type epitaxial layer can be formed. Moreover, an epitaxial layer is not necessarily essential.

In the present invention, by forming a protection layer on a division section outside a light receiving area for dividing a light receiving element and a vicinity of the division section, the division section and its vicinity outside the light receiving area are protected against, for example, etching. As a result, the appearance of a crystal defect, a change in impurity concentration, or the like in the division section and its vicinity outside the light receiving area can be prevented. This suppresses a leakage current. Therefore, a high-performance high-quality semiconductor device with a built-in light receiving element can be actualized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device with a built-in light receiving element and a MOS transistor, the method comprising:

forming an isolation section which defines a first element area in which a plurality of light receiving elements are formed and a second element area which the MOS transistor is formed;

forming a division section for dividing the plurality of light receiving elements in the first element area;

forming an antireflection coating on a light receiving area formed in a part of a divided element area of the element area, on the division section around the light receiving area, and on the division section around an area outside the light receiving area of the divided element area; and forming a protection layer for protecting the antireflection coating on the antireflection coating formed on the light receiving area, on the division section around the light receiving area, and on the division section around the area outside the light receiving area and a gate electrode area in the second area;

forming an insulating layer above the first area and the second area; and etching the insulating layer to form a sidewall in the gate electrode area while protecting the antireflection coating with the protection layer on the antireflection coating formed on the light receiving area, on the division section around the light receiving area, and on the division section around the area outside the light receiving area.

2. The method according to claim 1, wherein the protection layer is formed on the antireflection coating on the light receiving area of the divided element area, on the antireflection coating on the division section around the light receiving area, and on the antireflection coating on the division section around the area outside the light receiving area of the divided area simultaneously.

3. The method according to claim 2, wherein the protection layer is formed by using polycrystalline silicon.

4. The method according to claim 1, wherein the protection layer is formed by forming a second protection layer on the antireflection coating on the division section around the area outside the light receiving area of the divided element area after forming a first protection layer on the antireflection coating on the light receiving area of the divided element area and on the antireflection coating on the division section around the light receiving area.

5. The method according to claim 4, wherein:
the first protection layer is formed by using polycrystalline silicon; and
the second protection layer is formed by using a photoresist.

6. The method according to claim 5, wherein the second protection layer is an insulating film for forming a sidewall of a MOS transistor.

7. The method according to claim 1, wherein the division section is an area for dividing the plurality of light receiving elements by a pn junction.

8. The method according to claim 1, wherein there is etching selectivity between the protection layer and the antireflection coating.

9. The method according to claim 1, further comprising the process of performing etching with the protection layer as an etching stopper after the process of forming the protection layer on the antireflection coating.

10. The method according to claim 9, further comprising the process of removing the protection layer after the etching process.

* * * * *